(12) United States Patent
Kim

(10) Patent No.: US 9,899,379 B2
(45) Date of Patent: Feb. 20, 2018

(54) SEMICONDUCTOR DEVICES HAVING FINS

(71) Applicant: Samsung Electronics Co., Ltd., Suwon-si (KR)

(72) Inventor: Dong-Woo Kim, Incheon (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/989,196

(22) Filed: Jan. 6, 2016

(65) Prior Publication Data
US 2016/0343707 A1 Nov. 24, 2016

(30) Foreign Application Priority Data
May 21, 2015 (KR) .................. 10-2015-0070899

(51) Int. Cl.
H01L 29/165 (2006.01)
H01L 27/088 (2006.01)
H01L 29/78 (2006.01)
H01L 29/417 (2006.01)
H01L 29/66 (2006.01)

(52) U.S. Cl.
CPC .... *H01L 27/0886* (2013.01); *H01L 29/41783* (2013.01); *H01L 29/41791* (2013.01); *H01L 29/66545* (2013.01); *H01L 29/785* (2013.01); *H01L 29/7848* (2013.01); *H01L 29/165* (2013.01)

(58) Field of Classification Search
CPC ................................................. H01L 27/0886
See application file for complete search history.

(56) References Cited

U.S. PATENT DOCUMENTS

| 6,156,654 | A | 12/2000 | Ho et al. |
| 6,319,783 | B1 | 11/2001 | Ang et al. |
| 6,376,319 | B2 | 4/2002 | Ang et al. |
| 6,455,384 | B2 | 9/2002 | Ang et al. |
| 6,525,403 | B2 * | 2/2003 | Inaba ............... H01L 29/42384 257/329 |
| 6,544,888 | B2 | 4/2003 | Lee |
| 7,358,550 | B2 | 4/2008 | Nakabayashi et al. |
| 7,425,500 | B2 * | 9/2008 | Metz ............... H01L 21/28518 257/E21.43 |
| 7,795,689 | B2 | 9/2010 | Kawakita |
| 7,915,693 | B2 * | 3/2011 | Okano ............. H01L 29/66795 257/329 |
| 7,977,154 | B2 | 7/2011 | Koshka et al. |
| 8,507,349 | B2 | 8/2013 | Lee |

(Continued)

FOREIGN PATENT DOCUMENTS

| JP | 3391181 | 10/1997 |
| JP | 4152636 | 8/2003 |

(Continued)

*Primary Examiner* — Eugene Lee
(74) *Attorney, Agent, or Firm* — Muir Patent Law, PLLC

(57) ABSTRACT

A semiconductor device includes a first fin on a substrate, a gate electrode on the substrate to intersect the first fin, an epitaxial layer on both sides of the gate electrode to contact side surfaces of the first fin, and a metal alloy layer which contacts an upper surface of the first fin and part of the epitaxial layer, wherein a first region of the first fin has a higher doping concentration than a second region of the first fin which is located under the first region.

20 Claims, 37 Drawing Sheets

(56) References Cited

U.S. PATENT DOCUMENTS

| | | | |
|---|---|---|---|
| 8,541,280 B2 | 9/2013 | Yin et al. | |
| 8,659,032 B2* | 2/2014 | Chao | H01L 29/66795 257/384 |
| 8,785,285 B2 | 7/2014 | Tsai et al. | |
| 8,796,695 B2* | 8/2014 | Liao | H01L 29/66484 257/190 |
| 9,054,194 B2* | 6/2015 | Tung | H01L 29/41791 |
| 9,543,438 B2* | 1/2017 | Tsai | H01L 29/7848 |
| 9,608,114 B2* | 3/2017 | Kim | H01L 29/7849 |
| 2006/0071275 A1* | 4/2006 | Brask | H01L 21/845 257/350 |
| 2011/0073952 A1* | 3/2011 | Kwok | H01L 29/045 257/368 |
| 2011/0272763 A1* | 11/2011 | Sasaki | H01L 29/7854 257/347 |
| 2013/0113027 A1 | 5/2013 | Chiang et al. | |
| 2013/0181264 A1 | 7/2013 | Liao et al. | |
| 2013/0187228 A1* | 7/2013 | Xie | H01L 29/785 257/347 |
| 2013/0234204 A1* | 9/2013 | Kang | H01L 29/7851 257/190 |
| 2013/0249003 A1* | 9/2013 | Oh | H01L 21/845 257/347 |
| 2014/0203370 A1* | 7/2014 | Maeda | H01L 29/785 257/365 |
| 2014/0264482 A1 | 9/2014 | Li et al. | |
| 2014/0273365 A1 | 9/2014 | Wei et al. | |
| 2016/0027918 A1 | 1/2016 | Kim et al. | |
| 2016/0087104 A1 | 3/2016 | Lee et al. | |
| 2016/0099150 A1* | 4/2016 | Tsai | H01L 21/2252 257/401 |
| 2016/0365452 A1* | 12/2016 | Tung | H01L 29/7853 |

FOREIGN PATENT DOCUMENTS

| | | |
|---|---|---|
| KR | 10-2007-0036202 | 4/2007 |
| KR | 10-2009-0083671 | 8/2009 |
| KR | 10-2011-0077948 | 7/2011 |
| KR | 10-1124565 | 3/2012 |

\* cited by examiner

1400

SEMICONDUCTOR DEVICES HAVING FINS

This application claims priority under 35 U.S.C. § 119 to Korean Patent Application No. 10-2015-0070899, filed on May 21, 2015, in the Korean Intellectual Property Office, the disclosure of which is incorporated herein by reference in its entirety.

BACKGROUND

1. Technical Field

The present disclosure relates to a semiconductor device having a fin.

2. Description of the Related Art

As one of the scaling techniques for increasing the density of a semiconductor device, a multi-gate transistor has been suggested. The multi-gate transistor is obtained by forming a semiconductor fin on a substrate and forming a gate on the surface of the semiconductor fin.

The multi-gate transistor can be easily scaled because it uses a three-dimensional (3D) channel. In addition, the current control capability can be improved without the need to increase the gate length of the multi-gate transistor. Moreover, it is possible to effectively suppress a short channel effect (SCE) in which an electric potential of a channel region is affected by a drain voltage.

However, as a logic device becomes more highly integrated, design rules are scaled-down. This increases the effect of contact resistance on the performance of a semiconductor device.

SUMMARY

Aspects of the disclosed embodiments may provide a semiconductor device which may improve contact resistance by reducing a barrier height at a contact interface.

However, aspects of the disclosed embodiments are not restricted to those set forth herein.

The above and other aspects of the disclosed embodiments will become more apparent to one of ordinary skill in the art to which the disclosed embodiments pertains by referencing the detailed description of the disclosed embodiments given below.

According to an aspect of the disclosed embodiments, a semiconductor device may include a first fin provided with a substrate, a gate electrode on the substrate to intersect the first fin, an epitaxial layer on both sides of the gate electrode to contact side surfaces of the first fin, and a metal alloy layer which contacts an upper surface of the first fin and part of the epitaxial layer, wherein a first region of the first fin has a higher doping concentration than a second region of the first fin which is located under the first region.

In some embodiments, the first region may contact the metal alloy layer.

In some embodiments, the doping concentration of the first region may be increased by a low-energy insert ion implantation (IIP), plasma doping (PLAD), or gas phased doping (GPD) process.

In some embodiments, the first region may be formed only under the metal alloy layer.

In some embodiments, the semiconductor device may further include a spacer on at least one sidewall of the gate electrode, wherein the epitaxial layer contacts a sidewall of the spacer and a sidewall of the metal alloy layer.

In some embodiments, the metal alloy layer may be separated from the spacer.

In some embodiments, the semiconductor device may further include a contact on the metal alloy layer, wherein the entire upper surface of the metal alloy layer contacts the entire lower surface of the contact.

In some embodiments, the metal alloy layer may include silicide.

In some embodiments, the metal alloy layer may include titanium (Ti) or cobalt (Co).

In some embodiments, the semiconductor device may further include a first interlayer insulating film on the substrate, and a second interlayer insulating film on the first interlayer insulating film and the gate electrode, wherein the upper surface of the metal alloy layer is lower than an upper surface of the first interlayer insulating film.

In some embodiments, the upper surface of the first fin overlapped by the gate electrode may be higher than a lower surface of the metal alloy layer.

In some embodiments, the upper surface of the metal alloy layer may be higher than the epitaxial layer.

According to another aspect of the disclosed embodiments, a semiconductor device may include a first fin provided with a substrate, a gate electrode on the substrate to intersect the first fin, an epitaxial layer on both sides of the gate electrode to surround the first fin, a metal alloy layer on the epitaxial layer, and a contact on the metal alloy layer, wherein a first region of the epitaxial layer has a higher doping concentration than a second region of the epitaxial layer which is located under the first region.

In some embodiments, the entire upper surface of the metal alloy layer may contact the entire lower surface of the contact.

In some embodiments, wherein an upper surface of the metal alloy layer may be smaller than that of an upper surface of the epitaxial layer.

In some embodiments, the semiconductor device may further include spacers which are respectively formed on both sidewalls of the gate electrode, wherein the epitaxial layer contacts sidewalls of the spacers, and the metal alloy layer is separated from the sidewalls of the spacers.

In some embodiments, the first region may contact the metal alloy layer.

In some embodiments, the metal alloy layer may include silicide.

According to still another aspect of the disclosed embodiments, a semiconductor device may include a first fin and a second fin provided with a substrate, a gate electrode on the substrate to intersect the first fin and the second fin, an epitaxial layer on both sides of the gate electrode to contact the first fin and the second fin, and a metal alloy layer which contacts an upper surface of the epitaxial layer, wherein a first region of the epitaxial layer which contacts the metal alloy layer has a higher doping concentration than a second region of the epitaxial layer which is different from the first region.

In some embodiments, the metal alloy layer may contact upper surfaces of the first and second fins, the epitaxial layer contacts side surfaces of the first and second fins, and a first region of the first fin has a higher doping concentration than a second region of the first fin which is located under the first region.

In some embodiments, the semiconductor device may further include spacers which are respectively formed on both sidewalls of the gate electrode, wherein the epitaxial layer contacts sidewalls of the spacers and sidewalls of the metal alloy layer.

In some embodiments, the metal alloy layer may be separated from the spacers.

In some embodiments, the first region of the first fin may contact the metal alloy layer.

In some embodiments, an upper surface of the metal alloy layer may be higher than the upper surface of the epitaxial layer.

In some embodiments, the epitaxial layer may contact the upper surfaces of the first and second fins and surrounds the upper surface and both side surfaces of each of the first and second fins, and the metal alloy layer contacts the upper surface of the epitaxial layer.

In some embodiments, the semiconductor device may further include spacers which are respectively formed on both sidewalls of the gate electrode, wherein the epitaxial layer contacts sidewalls of the spacers, and the metal alloy layer is separated from the sidewalls of the spacers.

In some embodiments, an upper surface of the first fin which contacts the epitaxial layer may lie in the same plane with an upper surface of the first fin which contacts the gate electrode.

In some embodiments, the semiconductor device may further include a contact on the metal alloy layer, wherein the entire upper surface of the metal alloy layer contacts the entire lower surface of the contact.

In some embodiments, the semiconductor device may further include a contact on the metal alloy layer, wherein the epitaxial layer contacts only the upper surfaces of the first and second fins, the metal alloy layer contacts the upper surface of the epitaxial layer, and the entire upper surface of the metal alloy layer contacts the entire lower surface of the contact.

In some embodiments, the epitaxial layer may have at least one of a diamond shape, a circular shape, and a rectangular shape.

In some embodiments of the present inventive concept, the metal alloy layer may be formed to a uniform thickness on the epitaxial layer.

In some embodiments, a lower surface of the epitaxial layer may be lower than the upper surface of the first fin which contacts the gate electrode.

In some embodiments, the semiconductor device may further include spacers which are respectively formed on both sidewalls of the gate electrode, wherein the epitaxial layer contacts the sidewalls of the spacers, and the metal alloy layer is separated from the sidewalls of the spacers.

In some embodiments, the metal alloy layer may include silicide.

In some embodiments, a doping concentration of the first region of the epitaxial layer may be increased by a low-energy IIP, PLAD, or GPD process.

In some embodiments, the semiconductor device may further include spacers on both sidewalls of the gate electrode, and a gate insulating layer under the gate electrode to contact the first fin and the second fin, wherein the gate insulating layer is conformally formed along sidewalls of the spacers and the upper surfaces of the first and second fins, and the gate electrode is conformally formed along an upper surface of the gate insulating layer.

BRIEF DESCRIPTION OF THE DRAWINGS

The above and other aspects and features of the disclosed embodiments will become more apparent by describing example embodiments thereof with reference to the attached drawings, in which.

DETAILED DESCRIPTION

Figure 1:
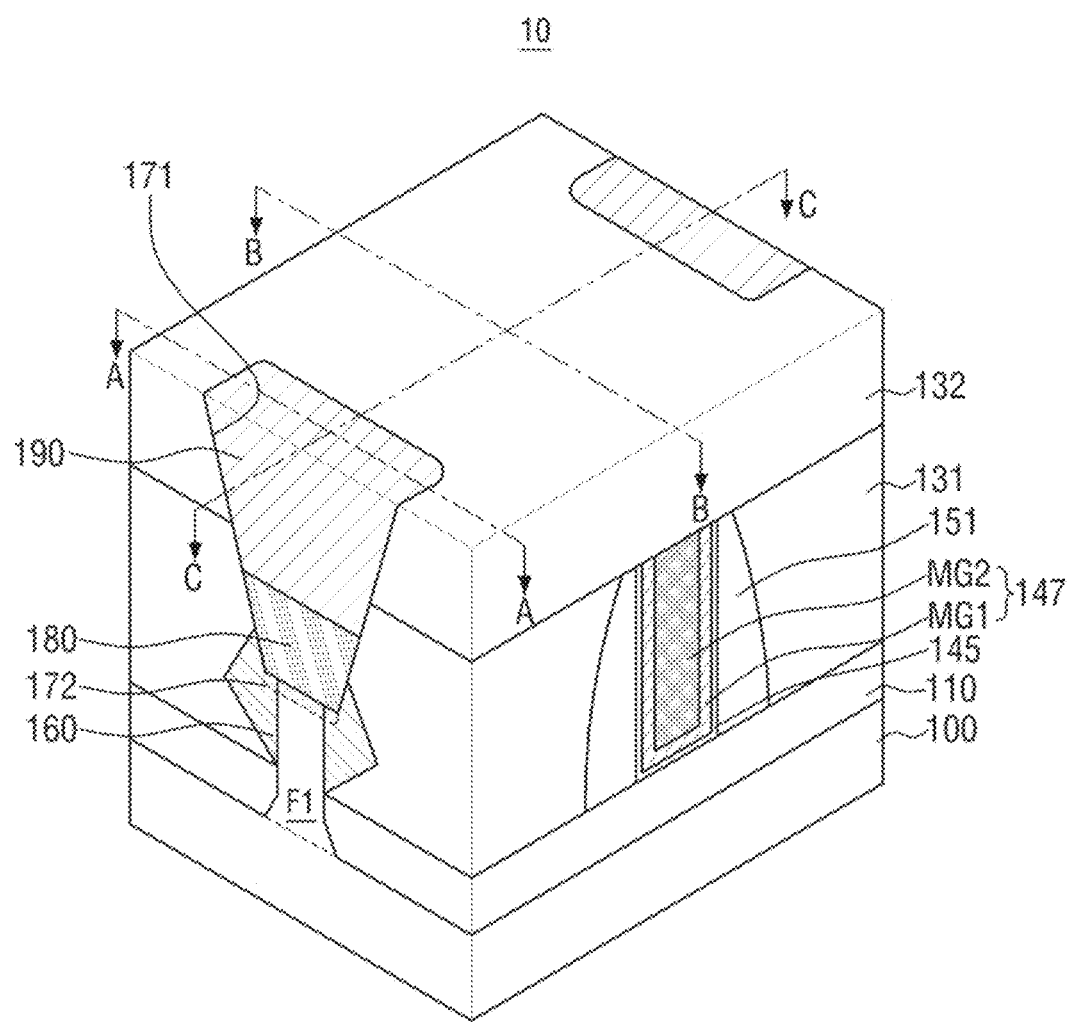
FIG. 1 is a perspective view of a semiconductor device according to a first exemplary embodiment.

Advantages and features of the disclosed embodiments and methods of accomplishing the same may be understood more readily by reference to the following detailed description of certain embodiments and the accompanying drawings. The disclosed concepts may, however, be embodied in many different forms and should not be construed as being limited to the embodiments set forth herein. As used herein, like reference numerals refer to like elements throughout the specification.

The terminology used herein is for the purpose of describing disclosed embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to", "coupled to", and/or "adjacent to" another element or layer, it can be directly on, connected to, coupled to, or adjacent to the other element or layer or intervening elements or layers may be present. In contrast, when an element is referred to as being "directly on". "directly connected to" "directly coupled to", or "directly adjacent to" another element or layer, there are no intervening elements or layers present. However, the term "contact," as used herein, refers to direct contact (i.e., touching) unless the context indicates otherwise.

As used herein, the term "and/or" includes any and all combinations of one or more of the associated listed items. Also, the term "exemplary" is intended to refer to an example or illustration.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another/other element, component, region, layer or section. Thus, a first element, component, region, layer or section discussed below could be termed a second element, component, region, layer or section without departing from the teachings of the disclosed embodiments.

Spatially relative terms, such as "beneath", "below", "lower", "under", "above", "upper", and the like, may be used herein for ease of description to describe one element's or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below", "beneath", or "under" another/other element(s) or feature(s) would then be oriented "above", "on," or "on top of" the another/other element(s) or feature(s). Thus, for example, the term "below" can encompass both an orientation of above and below. The device may be otherwise oriented (rotated 90 degrees or at other orientations) and the spatially relative descriptors used herein may be interpreted accordingly. Also, as used herein, these spatially relative terms such as "above" and "below" have their ordinary broad meanings—for example element A can be above element B even if, when looking down on the two elements, there is no overlap between them (just as something in the sky is generally above something on the ground, even if it is not directly above). In addition, it will also be understood that when a layer is referred to as being "between" two layers, it can be the only layer between the two layers, or one or more intervening layers may also be present.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Embodiments are described herein with reference to cross-sectional views and/or plan views that are schematic illustrations of idealized embodiments (and intermediate structures). As such, variations from the shapes of the illustrations as a result, for example, of manufacturing techniques and/or tolerances, are to be expected. Thicknesses of layers and areas are exaggerated for effective description of the technical contents in the drawings. Thus, these embodiments should not be construed as limited to the particular shapes of regions illustrated herein but are intended to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. And an etching area illustrated at a right angle may be round or have a predetermined curvature. Thus, the regions illustrated in the figures are schematic in nature and their shapes are not intended to illustrate the actual shape of a region of a device and are not intended to limit the scope of the disclosed embodiments.

Unless otherwise defined, all terms (including technical and scientific terms) used herein have the same meaning as commonly understood by one of ordinary skill in the art to which the disclosed embodiments belong. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Hereinafter, semiconductor devices according to exemplary embodiments will be described with reference to FIGS. 1 through 19.

Figure 2:
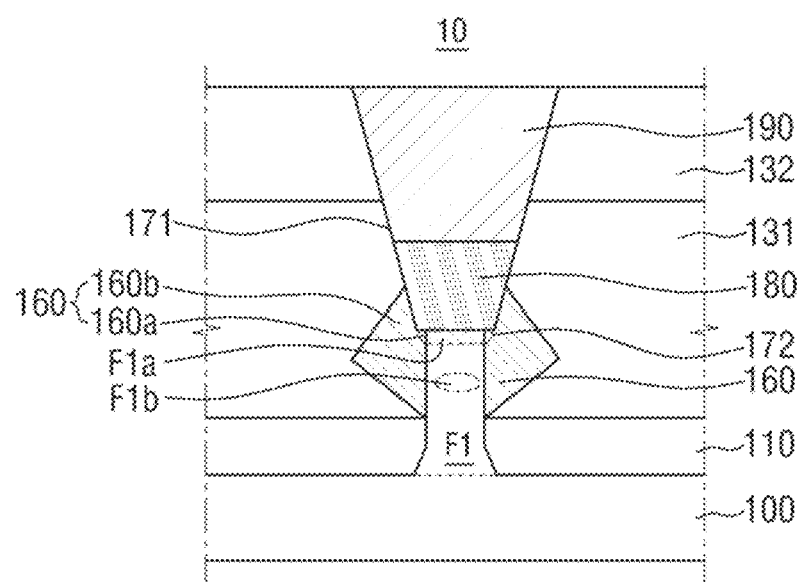
FIGS. 2, 3 and 4 are cross-sectional views of the exemplary semiconductor device of FIG. 1, taken along the lines A-A, B-B and C-C, respectively.
Figure 3:
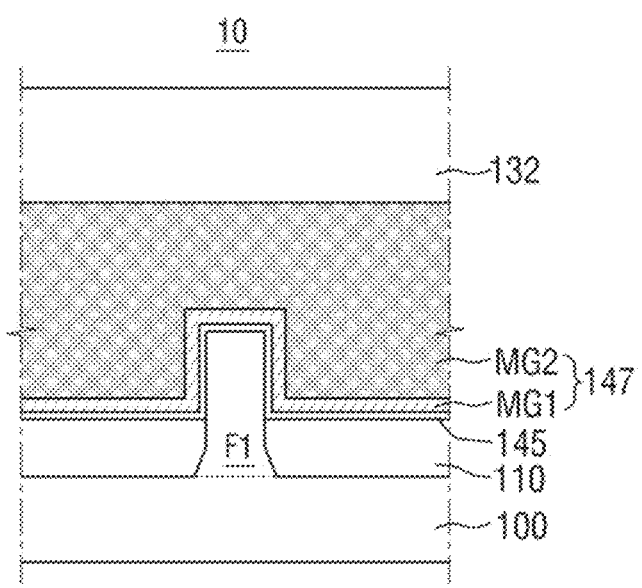
Figure 4:
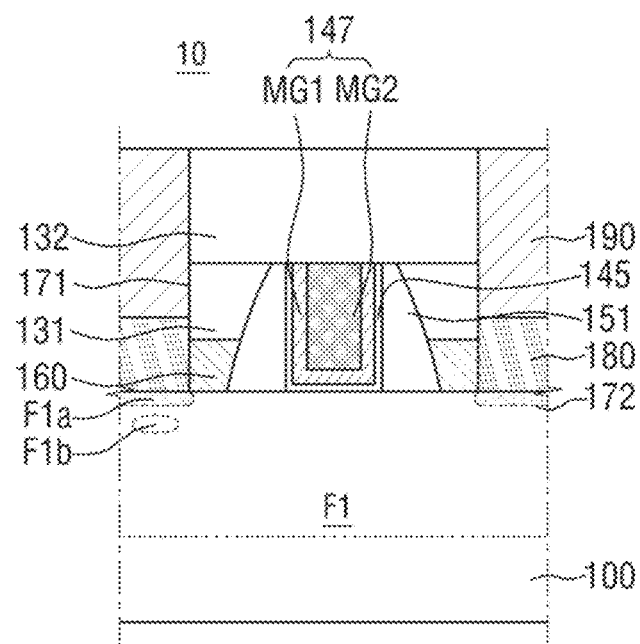

FIG. 1 is a perspective view of a semiconductor device 10 according to a first exemplary embodiment. FIGS. 2, 3 and 4 are cross-sectional views of the example semiconductor device 10 of FIG. 1, taken along the lines A-A, B-B and C-C, respectively.

Referring to FIGS. 1 through 4, the semiconductor device 10 according to the first exemplary embodiment may include a substrate 100, a first fin F1, a gate electrode 147, a spacer 151, an epitaxial layer 160, a metal alloy layer 180, a contact 190, a first interlayer insulating film 131, and a second interlayer insulating film 132.

In some embodiments, the substrate 100 may be made of one or more semiconductor materials selected from the group comprising Si, Ge, SiGe, GaP, GaAs, SiC, SiGeC, InAs, and InP. In addition, in some embodiments, the substrate 100 may be a silicon-on-insulator (SOI) substrate.

The first fin F1 may extend along a first direction. The first fin F1 may be part of the substrate 100 or may include an epitaxial layer grown from the substrate 100. In some embodiments, a device isolation layer 110 may cover side surfaces of the first fin F1 and an upper surface of the substrate 100.

The gate electrode 147 may be formed on the first fin F1 to intersect the first fin F1. For example, the gate electrode 147 may extend along a second direction that may be, in some embodiments, perpendicular to the first direction.

The gate electrode 147 may include metal layers (e.g., MG1, MG2). As illustrated in the exemplary drawings, the gate electrode 147 may be formed by stacking two or more metal layers (e.g., MG1, MG2). In some embodiments, a first metal layer MG1 may control a work function, and a second metal layer MG2 may fill a space formed by the first metal layer MG1. For example, the first metal layer MG1 may include at least one of TiN, TaN, TiC, and TaC. In addition, the second metal layer MG2 may include W or Al. Alternatively, the gate electrode 147 may be made of a material (e.g., Si or SiGe) other than a metal. The gate electrode 147 may be formed by, but not be limited to, a replacement process.

A gate insulating layer 145 may be formed between the first fin F1 and the gate electrode 147. As illustrated in FIG. 3, the gate insulating layer 145 may be formed on upper and side surfaces of the first fin F1. In addition, the gate insulating layer 145 may be disposed between the gate electrode 147 and the device isolation layer 110. In some embodiments, the gate insulating layer 145 may include a high-k material having a higher dielectric constant than a silicon oxide layer. For example, the gate insulating layer 145 may include $HfO_2$, $ZrO_2$, or $Ta_2O_5$.

The spacer 151 may include, in certain embodiments, at least one of a nitride layer and an oxynitride layer.

The epitaxial layer 160 may be formed on the first fin F1 on both sides of the gate electrode 147.

The epitaxial layer 160 may have various shapes. The epitaxial layer 160 may surround part of the first fin F1. For example, the epitaxial layer 160 may contact only sidewalls of the first fin F1, but the present inventive concept is not limited thereto. In addition, the epitaxial layer 160 may contact the metal alloy layer 180. The epitaxial layer 160 may operate as a source or drain of the semiconductor device 10.

The epitaxial layer 160 may include a first region 160a and a second region 160b. The first region 160a of the epitaxial layer 160 may be included in a doping region 172. The second region 160b may be a region of the epitaxial layer 160 excluding the first region 160a. The first region 160a may have a higher doping concentration than the second region 160b. The first region 160a may be formed to have a higher doping concentration than the second region 160b by a low-energy insert ion implantation (IIP), plasma doping (PLAD), or gas phased doping (GPD) process. The doping process may use a mixed gas that contains $B_{18}$ or $B_{36}$, also referred to herein as B18 or B36, respectively. In addition, the first region 160a may be formed to a depth of 1 to 2 nm by the low-energy doping process, but the exemplary embodiments are not limited thereto.

An upper surface of the first region 160a may lie in the same plane with an upper surface of the first fin F1. The first region 160a may contact the metal alloy layer 180. In addition, the first region 160a may be formed only under the metal alloy layer 180, but the exemplary embodiments are not limited thereto.

If the semiconductor device 10 according to the first exemplary embodiment is a p-channel metal oxide semiconductor (PMOS) transistor, the epitaxial layer 160 may include a compressive stress material. The compressive stress material may be a material (e.g., SiGe) having a greater lattice constant than Si. The compressive stress material may improve the mobility of carriers in a channel region by applying compressive stress to the first fin F1.

On the other hand, if the semiconductor device 10 according to the first exemplary embodiment is an n-channel metal oxide semiconductor (NMOS) transistor, the epitaxial layer 160 may include the same material as the substrate 100 or a tensile stress material. For example, if the substrate 100 is made of Si, the epitaxial layer 160 may be made of Si or a material (e.g., SiC) having a smaller lattice constant than Si.

Like the epitaxial layer 160, the first fin F1 may also include a first region F1a and a second region F1b. The first region F1a of the first fin F1 may be included in the doping region 172. The first region F1a may have a higher doping concentration than the second region F1b. The second region F1b may be located under the first region F1a. The first region F1a may be formed to have a higher doping concentration than the second region F1b by a low-energy IIP, PLAD, or GPD process. In some embodiments, the above doping process may use a mixed gas that contains B18 or B36. In addition, the first region F1a may be formed to a depth of 1 to 2 nm by the low-energy doping process, but the exemplary embodiments are not limited thereto.

In addition, the first region F1a may contact the metal alloy layer 180. Since the first region F1a of the first fin F1 has a higher doping concentration than the second region F1b, a shottky barrier height (SBH) between the metal alloy layer 180 and the first fin F1 may be reduced, and a short channel effect (SCE) may be improved. Accordingly, the performance of the semiconductor device 10 of the exemplary embodiments may be improved.

The metal alloy layer 180 may be formed on the epitaxial layer 160 and the first fin F1. The metal alloy layer 180 may contact part of the epitaxial layer 160 and the upper surface of the first fin F1.

The metal alloy layer 180 may include silicide. For example, the metal alloy layer 180 may include, but not be limited to, Ti or Co. As will be described later, a metal layer may be formed on the epitaxial layer 160 by plating and then made to react with the epitaxial layer 160 by heat treatment, thereby forming silicide. As a result, the metal alloy layer 180 may be completed. Since plating is used, silicide may be formed on an inner surface of the epitaxial layer 160 and the upper surface of the first fin F1 regardless of the shape of the epitaxial layer 160. Electroless plating or electro-plating may be used depending on the type of the metal layer.

The metal alloy layer 180 may be formed along the circumference of the epitaxial layer 160 and directly contact the first fin F1 and the contact 190.

The contact 190 may electrically connect a wiring to the epitaxial layer 160 or the first fin F1. The contact 190 may be made of, but not be limited to, for example, Al, Cu, or W. The contact 190 may penetrate through the first interlayer insulating film 131 and the second interlayer insulating film 132, but the exemplary embodiments are not limited thereto. For example, as illustrated in FIG. 4, an upper surface of the first interlayer insulating film 131 may lie in the same plane with an upper surface of the gate electrode 147. In some embodiments, the upper surface of the first interlayer insulating film 131 and the upper surface of the gate electrode 147 may be made to lie in the same plane by a planarization process (e.g., a chemical mechanical polishing (CMP) process). The second interlayer insulating film 132 may cover the gate electrode 147. Each of the first interlayer insulating film 131 and the second interlayer insulating film 132 may include at least one of an oxide layer, a nitride layer and an oxynitride layer.

Referring to FIG. 4, the spacer 151 may be formed on at least one sidewall of the gate electrode 147. For example, the spacer 151 may be formed on both sidewalls of the gate electrode 147.

In some embodiments, the epitaxial layer 160 may contact a sidewall of the spacer 151 and a sidewall of the metal alloy layer 180. That is, the epitaxial layer 160 may be disposed on the first fin F1 between the spacer 151 and the metal alloy layer 180. An upper surface of the metal alloy layer 180 may be higher than an upper surface of the epitaxial layer 160 and lower than the upper surface of the gate electrode 147. In addition, the upper surface of the metal alloy layer 180 may be lower than the upper surface of the first interlayer insulating film 131. However, the exemplary embodiments are not limited thereto.

The metal alloy layer 180 may be separated from the spacer 151. That is, the first interlayer insulating film 131 may be disposed between the metal alloy layer 180 and the spacer 151.

The metal alloy layer 180 may contact the contact 190. In some embodiments, the metal alloy layer 180 may be located under the contact 190, and the entire upper surface of the metal alloy layer 180 may contact the entire lower surface of the contact 190.

The doping region 172 may be formed only in a part of the first fin F1 which contacts the metal alloy layer 180. The doping region 172 may be formed to a thickness of approximately 1 to 2 nm under the metal alloy layer 180 and may not be overlapped by the spacer 151. However, the exemplary embodiments are not limited thereto.

The metal alloy layer 180 may directly contact the first fin F1 and the contact 190. The first region F1a of the first fin F1 which directly contacts the metal alloy layer 180 may have a higher doping concentration than the second region F1b. In addition, the first region 160a of the epitaxial layer 160 which directly contacts the metal alloy layer 180 may have a higher doping concentration than the second region 160b. Therefore, the semiconductor device 10 according to the first exemplary embodiment may have the SBH reduced and the SCE improved at an interface between the metal alloy layer 180 and the first fin F1 or between the metal alloy layer 180 and the epitaxial layer 160.

Figure 5:
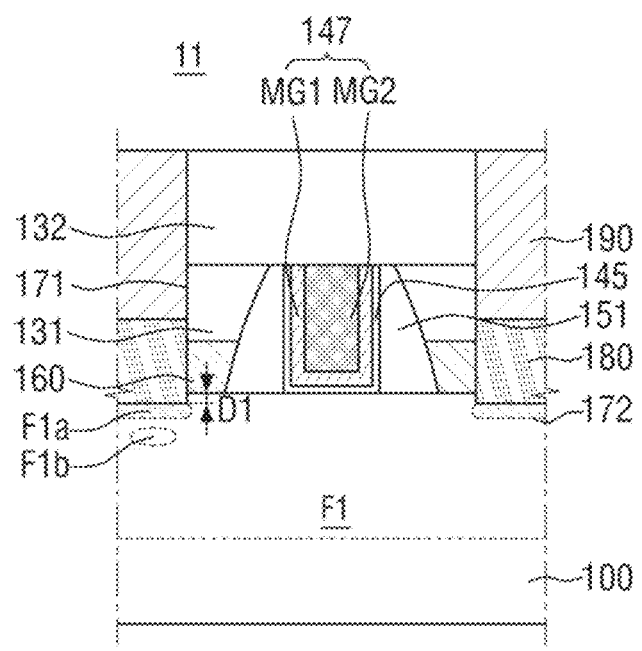
FIG. 5 is a cross-sectional view of a semiconductor device according to a second exemplary embodiment.

FIG. 5 is a cross-sectional view of a semiconductor device 11 according to a second exemplary embodiment. For simplicity, a description of elements substantially similar to those of the previous embodiment will be omitted, and the current embodiment will now be described, focusing mainly on differences with the previous exemplary embodiments.

Referring to FIG. 5, in the semiconductor device 11 according to the second exemplary embodiment, a metal alloy layer 180 and a contact 190 may be formed after the formation of a contact recess 171. When an epitaxial layer 160 is etched to form the contact recess 171, part of a first fin F1 may also be etched.

Accordingly, an upper surface of the first fin F1 which is overlapped by a gate electrode 147 may be higher than a lower surface of the metal alloy layer 180. That is, the upper surface of the first fin F1 located under the metal alloy layer 180 which operates as a source or drain may be lower than the upper surface of the first fin F1 located under the gate electrode 147 which operates as a channel by a first depth D1, but the exemplar) embodiments are not limited thereto.

Even in this case, a first region F1a of the first fin F1 which contacts the metal alloy layer 180 may have a higher doping concentration than a second region F1b located under the first region F1a.

Figure 6:
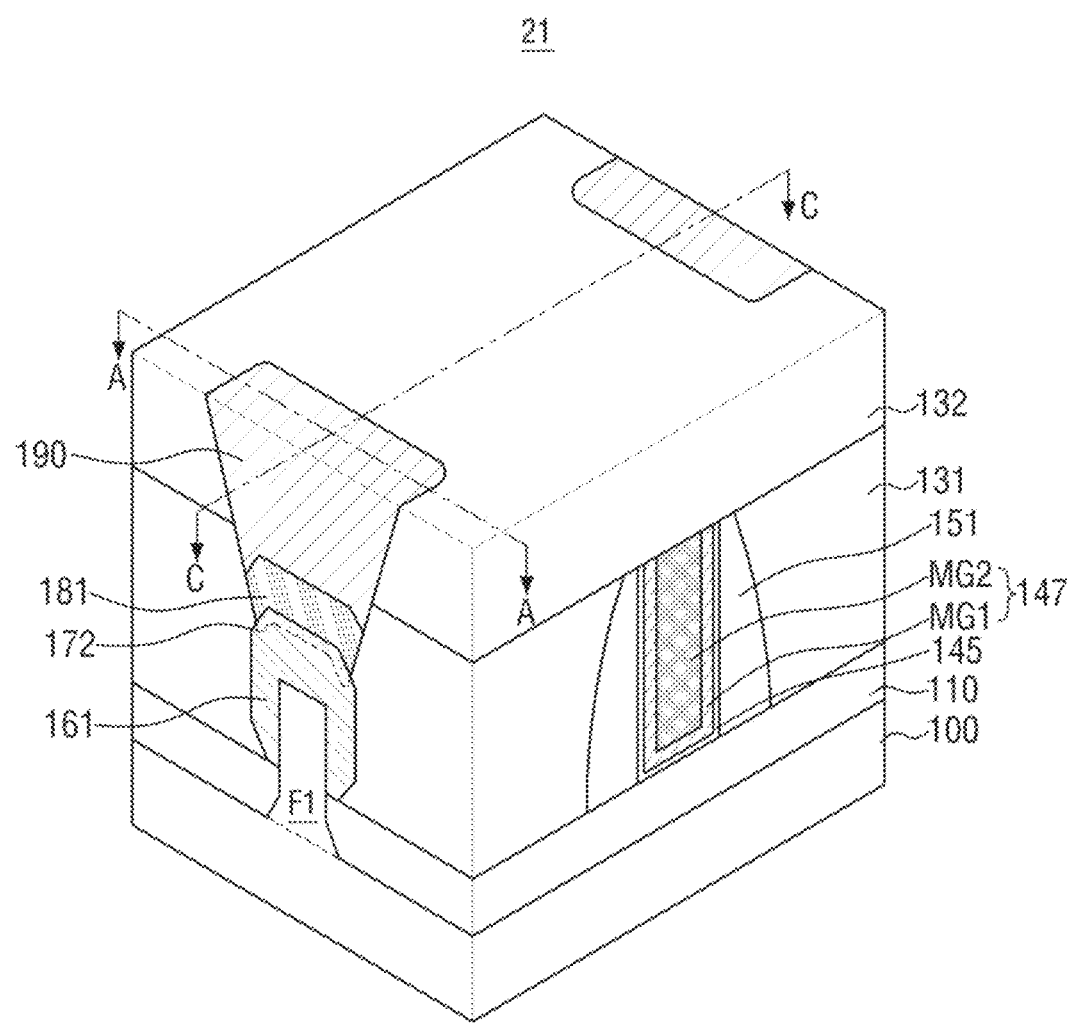
FIG. 6 is a perspective view of a semiconductor device according to a third exemplary embodiment.
Figure 7:
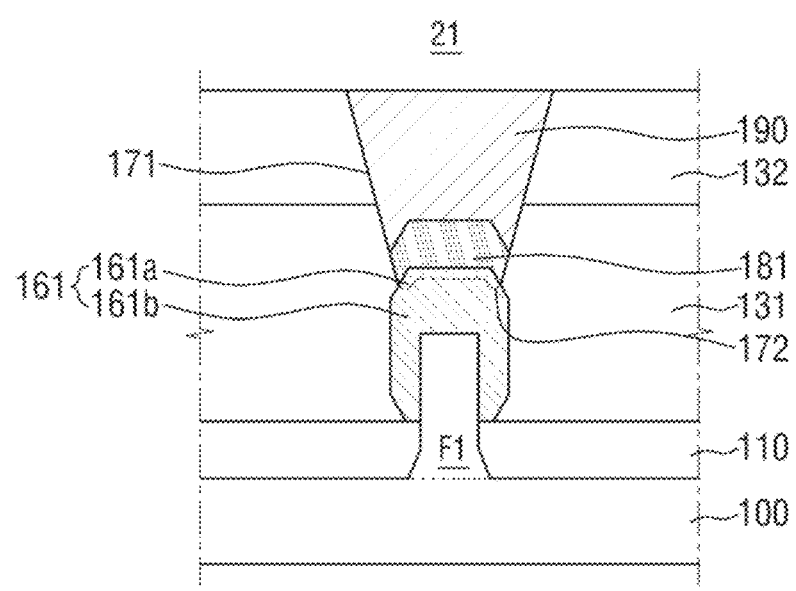
FIGS. 7 and 8 are cross-sectional views of the exemplary semiconductor device of FIG. 6, taken along the lines A-A and C-C, respectively.
Figure 8:
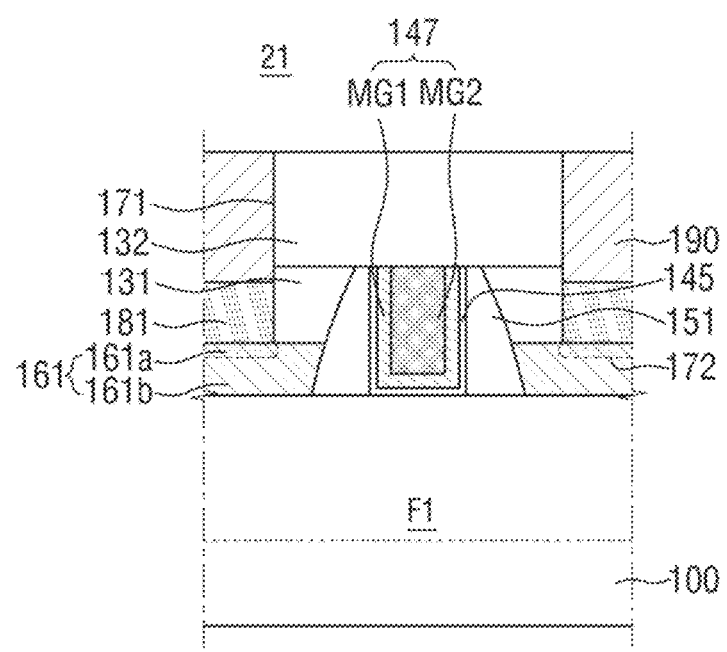

FIG. 6 is a perspective view of a semiconductor device 21 according to a third exemplary embodiment. FIGS. 7 and 8 are cross-sectional views of the semiconductor device 21 of FIG. 6, taken along the lines A-A and C-C, respectively. For simplicity, a description of elements substantially identical to those of the previous embodiments will be omitted, and the current embodiment will now be described, focusing mainly on differences with the previous embodiments.

Referring to FIGS. 6 through 8, the semiconductor device 21 according to the third exemplary embodiment may include a substrate 100, a first fin F1, a gate electrode 147, a spacer 151, an epitaxial layer 161, a metal alloy layer 181, and a contact 190.

The first epitaxial layer 161 may be formed on the first fin F1 on both sides of the gate electrode 147. The epitaxial layer 161 may have various shapes. For example, the epitaxial layer 161 may have a circular or polygonal shape. The epitaxial layer 161 may surround an upper part of the first fin F1. For example, the epitaxial layer 161 may contact sidewalls and an upper surface of the first fin F1, but the exemplary embodiments are not limited thereto. In addition, the epitaxial layer 161 may contact the metal alloy layer 181. The epitaxial layer 161 may operate as a source or drain of the semiconductor device 21.

In some exemplary embodiments, if the semiconductor device 21 is a PMOS transistor, the epitaxial layer 161 may include a compressive stress material. The compressive stress material may be a material (e.g., SiGe) having a greater lattice constant than Si. The compressive stress material may improve the mobility of carriers in a channel region by applying compressive stress to the first fin F1.

In other exemplary embodiments, if the semiconductor device 21 is an NMOS transistor, the epitaxial layer 161 may include the same material as the substrate 100 or a tensile stress material. For example, if the substrate 100 is made of Si, the epitaxial layer 161 may be made of Si or a material (e.g., SiC) having a smaller lattice constant than Si.

In addition, the epitaxial layer 161 may include a first region 161a and a second region 161b. The first region 161a of the epitaxial layer 161 may be disposed under the metal alloy layer 181. The second region 161b may be a region of the epitaxial layer 161 excluding the first region 161a. The first region 161a may have a higher doping concentration than the second region 161b. The first region 161a may be formed to have a higher doping concentration than the second region 161b by a low-energy IIP, PLAD, or GPD process. The above doping process may use a mixed gas that contains B18 or B36. In addition, the first region 161a may be formed to a depth of 1 to 2 nm by the low-energy doping process, but the exemplary embodiments are not limited thereto.

In addition, the first region 161a of the epitaxial layer 161 may contact the metal alloy layer 181. Since the first region 161a of the epitaxial layer 161 has a higher doping concentration than the second region 161b, the SBH between the metal alloy layer 181 and the epitaxial layer 161 may be reduced, and the SCE may be improved. Accordingly, the performance of the semiconductor device 21 of the exemplary embodiments may be improved.

The metal alloy layer 181 may be formed on the epitaxial layer 161. The metal alloy layer 181 may contact part of the epitaxial layer 161. The first region 161a of the epitaxial layer 161 may be formed only under the metal alloy layer 181. As illustrated in FIG. 7, the metal alloy layer 181 may be formed to a uniform thickness along an upper surface of the epitaxial layer 161, but the exemplary embodiments are not limited thereto.

The metal alloy layer 181 may include silicide. For example, the metal alloy layer 181 may include, but not limited to, Ti or Co. A metal layer may be formed on the epitaxial layer 161 by plating, and then made to react with the epitaxial layer 161 by heat treatment, thereby forming silicide. As a result, the metal alloy layer 181 may be formed. Since plating is used, silicide can be formed on the upper surface of the epitaxial layer 161 regardless of the shape of the epitaxial layer 161. Electroless plating or electro-plating may be used depending on the type of the metal layer.

The contact 190 may electrically connect a wiring to the epitaxial layer 161. The contact 190 may be made of, but not limited to, Al, Cu, or W. The contact 190 may penetrate through a first interlayer insulating film 131 and a second interlayer insulating film 132, but the exemplary embodiments are not limited thereto. For example, as illustrated in FIG. 8, an upper surface of the first interlayer insulating film 131 may lie in the same plane with an upper surface of the gate electrode 147. The upper surface of the first interlayer insulating film 131 and the upper surface of the gate electrode 147 may be made to lie in the same plane by a planarization process (e.g., a chemical mechanical polishing (CMP) process). The second interlayer insulating film 132 may cover the gate electrode 147. Each of the first interlayer insulating film 131 and the second interlayer insulating film 132 may include at least one of an oxide layer, a nitride layer and an oxynitride layer.

Referring to FIG. 8, the spacer 151 may be formed on at least one sidewall of the gate electrode 147. For example, the spacer 151 may be formed on both sidewalls of the gate electrode 147.

The epitaxial layer 161 may contact a sidewall of the spacer 151 and a lower surface of the metal alloy layer 181.

The metal alloy layer 181 may be separated from the spacer 151. That is, in some embodiments, the first interlayer insulating film 131 may be disposed between the metal alloy layer 181 and the spacer 151. An upper surface of the metal alloy layer 181 may be lower than the upper surface of the gate electrode 147. The upper surface of the metal alloy layer 181 may be lower than an upper surface of the first interlayer insulating film 131. In addition, the area of the upper surface of the metal alloy layer 181 may be smaller than that of the upper surface of the epitaxial layer 161. However, the exemplary embodiments are not limited thereto.

In certain embodiments, the metal alloy layer 181 may contact the contact 190. The metal alloy layer 181 may be located under the contact 190, and the entire upper surface of the metal alloy layer 181 may contact the entire lower surface of the contact 190.

In still other embodiments, the metal alloy layer 181 may directly contact the epitaxial layer 161 and the contact 190. The first region 161a of the epitaxial layer 161 which directly contacts the metal alloy layer 181 may have a higher doping concentration than the second region 161b. Therefore, the semiconductor device 21 may have the SBH reduced and the SCE improved at an interface between the metal alloy layer 181 and the epitaxial layer 161. Accordingly, the performance of the semiconductor device 21 of the exemplary embodiments may be improved.

Figure 9:
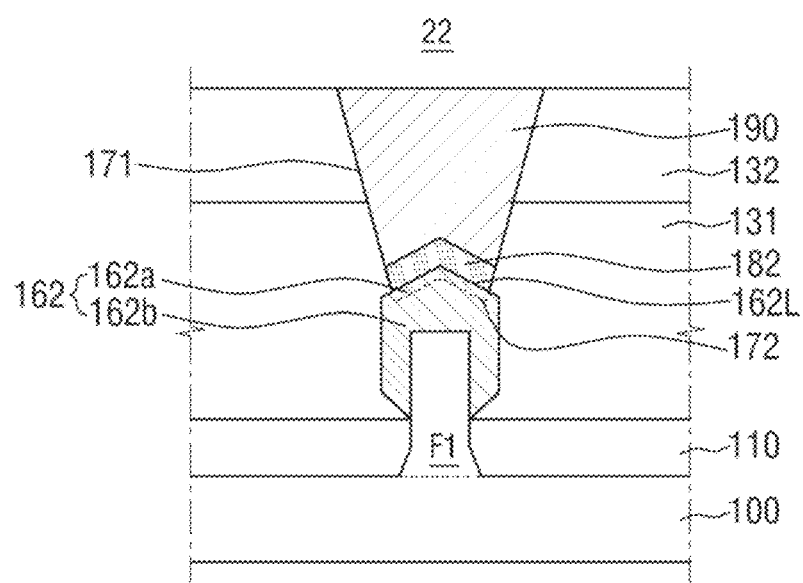
FIG. 9 is a cross-sectional view of a semiconductor device according to a fourth exemplary embodiment.

FIG. 9 is a cross-sectional view of a semiconductor device 22 according to a fourth exemplary embodiment. For simplicity, a description of elements substantially identical to those of the previous exemplary embodiments will be omitted, and the current embodiment will now be described, focusing mainly on differences with the previous embodiments.

Referring to FIG. 9, in the semiconductor device 22 according to the fourth exemplary embodiment, an upper part of an epitaxial layer 162 may include two inclined planes 162L that meet each other.

A metal alloy layer 182 may be formed on the two inclined planes 162L of the epitaxial layer 162 to contact the two inclined planes 162L. A first region 162a of the epitaxial layer 162 may be formed only under the metal alloy layer 182. The metal alloy layer 182 may be conformally formed along an upper surface of the epitaxial layer 162. However, the exemplary embodiments are not limited thereto.

Even in this exemplary embodiment, the first region 162a of the epitaxial layer 162 which contacts the metal alloy layer 182 may have a higher doping concentration than a second region 162b which is the remaining region of the epitaxial layer 162. In addition, the metal alloy layer 182 may be formed only under a contact 190. That is, the metal alloy layer 182 and the contact 190 may be formed only inside a contact recess 171.

Figure 10:
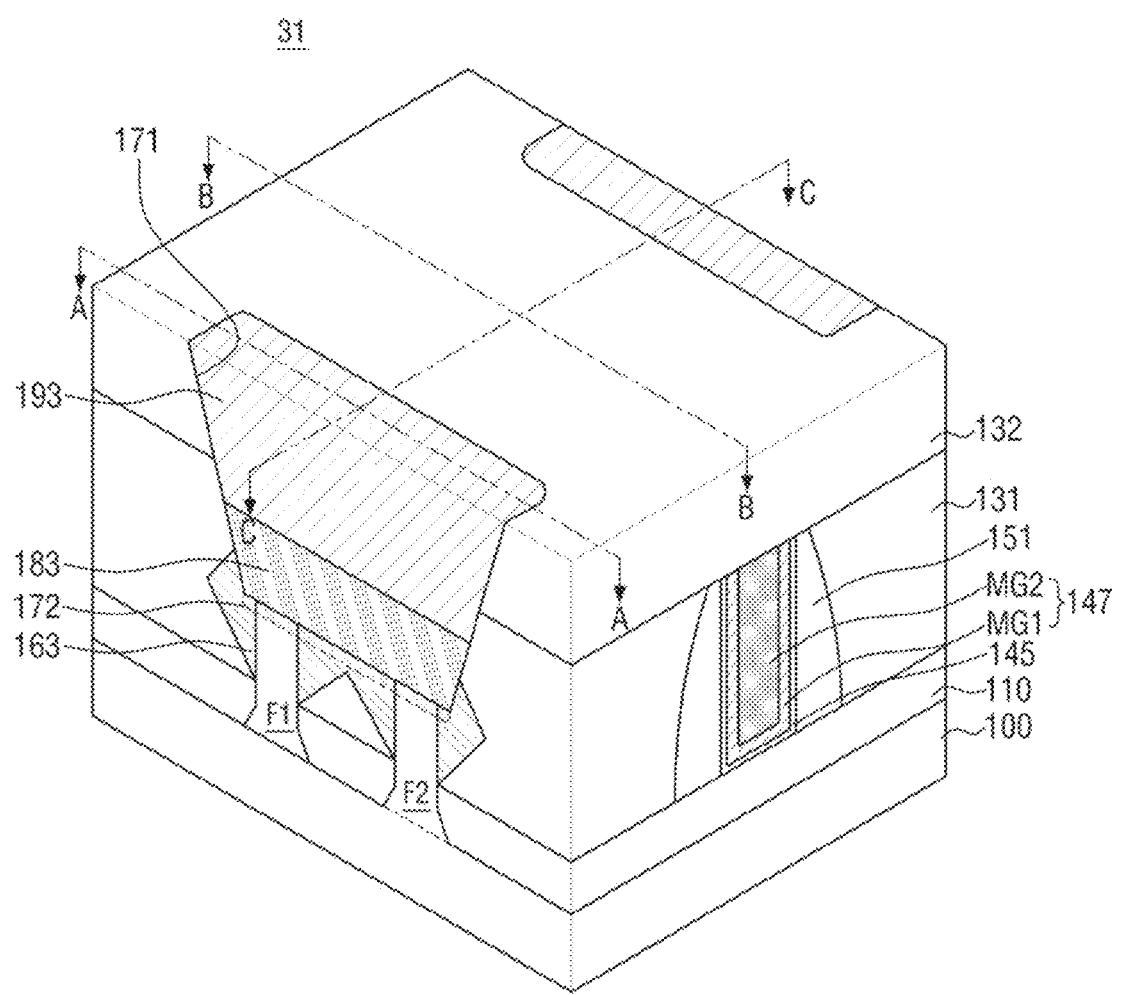
FIG. 10 is a perspective view of a semiconductor device according to a fifth exemplary embodiment.
Figure 11:
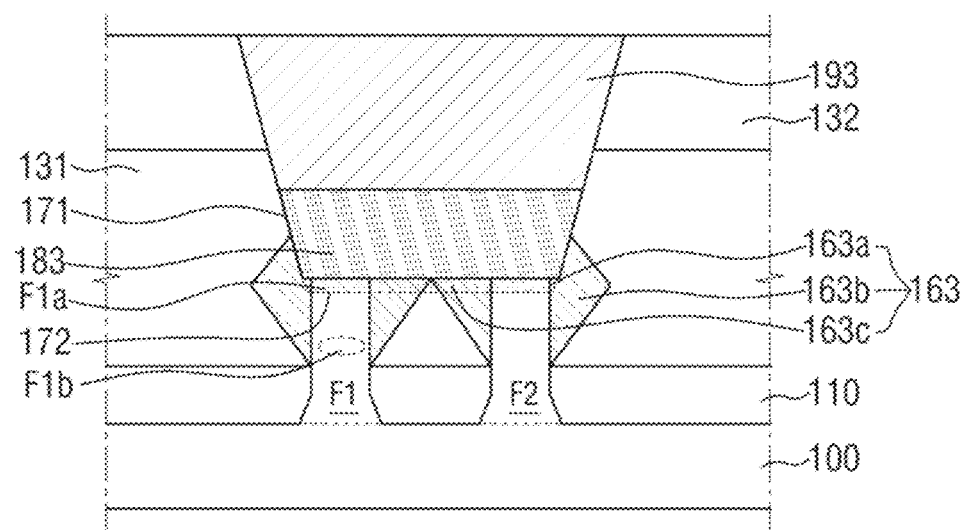
FIGS. 11, 12 and 13 are cross-sectional views of the exemplary semiconductor device of FIG. 10, taken along the lines A-A, B-B and C-C, respectively.
Figure 12:
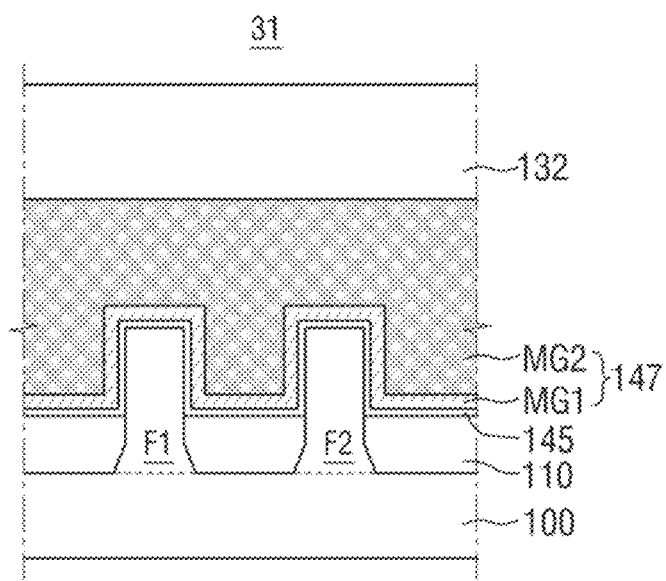
Figure 13:
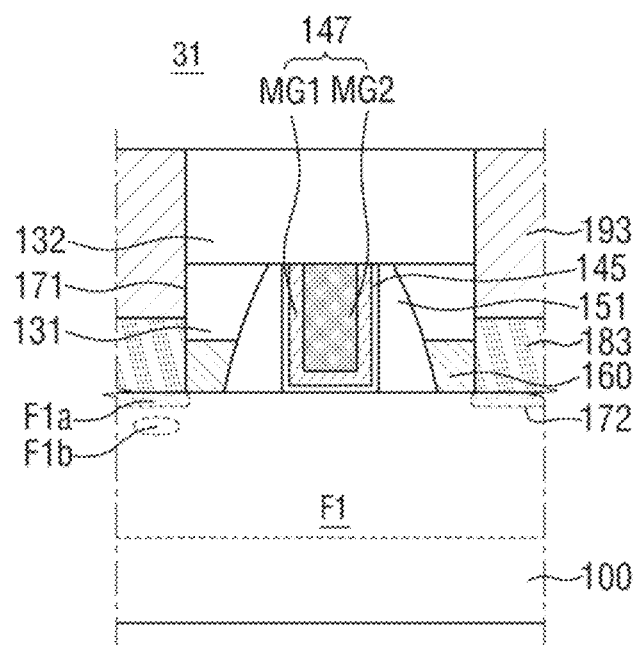

FIG. 10 is a perspective view of a semiconductor device 31 according to a fifth exemplary embodiment. FIGS. 11, 12 and 13 are cross-sectional views of the semiconductor device 31 of FIG. 10, taken along the lines A-A. B-B and C-C, respectively. For simplicity, a description of elements substantially identical to those of the previous exemplary embodiments will be omitted, and the current embodiment will now be described, focusing mainly on differences with the previous embodiments.

Referring to FIGS. 10 through 13, the semiconductor device 31 according to the fifth exemplary embodiment may include a substrate 100, a first fin F1, a second fin F2, a gate electrode 147, a spacer 151, an epitaxial layer 163, a metal alloy layer 183, and a contact 193.

In some embodiments, the first fin F1 and the second fin F2 may extend along a first direction to be separated from each other. The first fin F1 and the second fin F2 may be disposed parallel to each other, but the exemplary embodiments are not limited thereto. Each of the first fin F1 and the second fin F2 may be part of the substrate 100 or may include an epitaxial layer grown from the substrate 100. A device isolation layer 110 may cover sidewalls of the first and second fins F1 and F2 and an upper surface of the substrate 100.

The gate electrode 147 may be formed on the first fin F1 and the second fin F2 to intersect the first fin F1 and the second fin F2. For example, the gate electrode 147 may extend along a second direction perpendicular to the first direction.

The epitaxial layer 163 may be formed on the first fin F1 and the second fin F2 on both sides of the gate electrode 147. The epitaxial layer 163 may surround part of the first fin F1 and part of the second fin F2. For example, as illustrated in FIG. 10, the epitaxial layer 163 may contact only the sidewalls of the first and second fins F1 and F2. The epitaxial layer 160 may also be formed between the first fin F1 and the second fin F2. A surface of the epitaxial layer 163 may lie in the same plane with an upper surface of the first fin F1 and an upper surface of the second fin F2, but the exemplary embodiments are not limited thereto. The epitaxial layer 163 may operate as a source or drain of the semiconductor device 31.

In some embodiments, the epitaxial layer 163 may include a first region 163a and a second region 163b. The first region 163a of the epitaxial layer 163 may be included in a doping region 172. The second region 163b may be a region of the epitaxial layer 163 excluding the first region 163a. The first region 163a may have a higher doping concentration than the second region 163b. The first region 163a may be formed to have a higher doping concentration than the second region 163b by a low-energy IIP, PLAD, or GPD process. The above doping process may use a mixed gas that contains, for example, B18 or B36. In addition, the first region 163a may be formed to a depth of 1 to 2 nm by the low-energy doping process, but the exemplary embodiments are not limited thereto.

The first region 163a may contact the metal alloy layer 183. In addition, the first region 163a may be formed only under the metal alloy layer 183, but the exemplary embodiments are not limited thereto.

Like the epitaxial layer 163, the first fin F1 may also include a first region F1a and a second region F1b. The first region F1a of the first fin F1 may also be included in the doping region 172. The first region F1a may have a higher doping concentration than the second region F1b. The second region F1b may be located under the first region F1a. The first region F1a may be formed to have a higher doping concentration than the second region F1b by a low-energy IIP, PLAD, or GPD process. The above doping process may use a mixed gas that contains, for example, B18 or B36. In addition, the first region F1a may be formed to a depth of 1 to 2 nm by the low-energy doping process. The first region F1a of the first fin F1 may be disposed adjacent to the first region 163a of the epitaxial layer 163 and formed to the same depth as the first region 163a of the epitaxial layer 163. In some embodiments, the second fin F2 may be formed substantially identically to the first fin F1.

The doping region 172 may contact the metal alloy layer 183. Since the doping region 172 may have a higher doping concentration than its surrounding region, the SBH between the metal alloy layer 183 and the first fin F1 and between the metal alloy layer 183 and the second fin F2 may be reduced, and the SCE may be improved. Accordingly, the contact resistance of the semiconductor device 31 may be improved. In addition, the overall performance of the semiconductor device 31 may be improved.

The metal alloy layer 183 may be formed on the epitaxial layer 163, the first fin F1 and the second fin F2. The metal alloy layer 183 may contact part of the epitaxial layer 163, the upper surface of the first fin F1, and the upper surface of the second fin F2.

The metal alloy layer 183 may include silicide. In some embodiments, the metal alloy layer 183 may include Ti or Co. The metal alloy layer 183 may be formed within a contact recess 171 along the circumference of the epitaxial layer 163 and, in certain embodiments, may directly contact the first fin F1, the second fin F2 and the contact 193.

The contact 193 may electrically connect a wiring to the epitaxial layer 163, the first fin F1, or the second fin F2. The contact 193 may penetrate through a first interlayer insulating film 131 and a second interlayer insulating film 132, but the exemplary embodiments are not limited thereto. For example, as illustrated in FIG. 13, an upper surface of the first interlayer insulating film 131 may lie in the same plane with an upper surface of the gate electrode 147. The second interlayer insulating film 132 may cover the gate electrode 147.

Referring to FIG. 13, the spacer 151 may be formed on at least one sidewall of the gate electrode 147.

In some embodiments, the epitaxial layer 163 may contact a sidewall of the spacer 151 and a sidewall of the metal alloy layer 183. That is, the epitaxial layer 163 may be disposed on the first fin F1 between the spacer 151 and the metal alloy layer 183. An upper surface of the metal alloy layer 183 may be higher than an upper surface of the epitaxial layer 163 and lower than the upper surface of the gate electrode 147. In addition, the upper surface of the metal alloy layer 183 may be lower than the upper surface of the first interlayer insulating film 131. However, the exemplary embodiments are not limited thereto.

The metal alloy layer 183 may be separated from the spacer 151. That is, the first interlayer insulating film 131 may be disposed between the metal alloy layer 183 and the spacer 151.

The metal alloy layer 183 may contact the contact 193. The metal alloy layer 183 may be located under the contact 193, and the entire upper surface of the metal alloy layer 183 may contact the entire lower surface of the contact 193.

The doping region 172 may be formed to a thickness of approximately 1 to 2 nm under the metal alloy layer 183 and may not be overlapped by the spacer 151.

The metal alloy layer 183 may directly contact the first fin F1 and the contact 193. The first region F1a of the first fin F1 which directly contacts the metal alloy layer 183 may have a higher doping concentration than the second region F1b. In addition, the first region 163a of the epitaxial layer 163 which directly contacts the metal alloy layer 183 may have a higher doping concentration than the second region 163b. Therefore, the semiconductor device 31 according to the fifth exemplary embodiment may have the SBH reduced and the SCE improved at an interface between the metal alloy layer 183 and the first and second fins F1 and F2 or between the metal alloy layer 183 and the epitaxial layer 163. Accordingly, the performance of the semiconductor device 31 of the exemplary embodiments may be improved.

Figure 14:
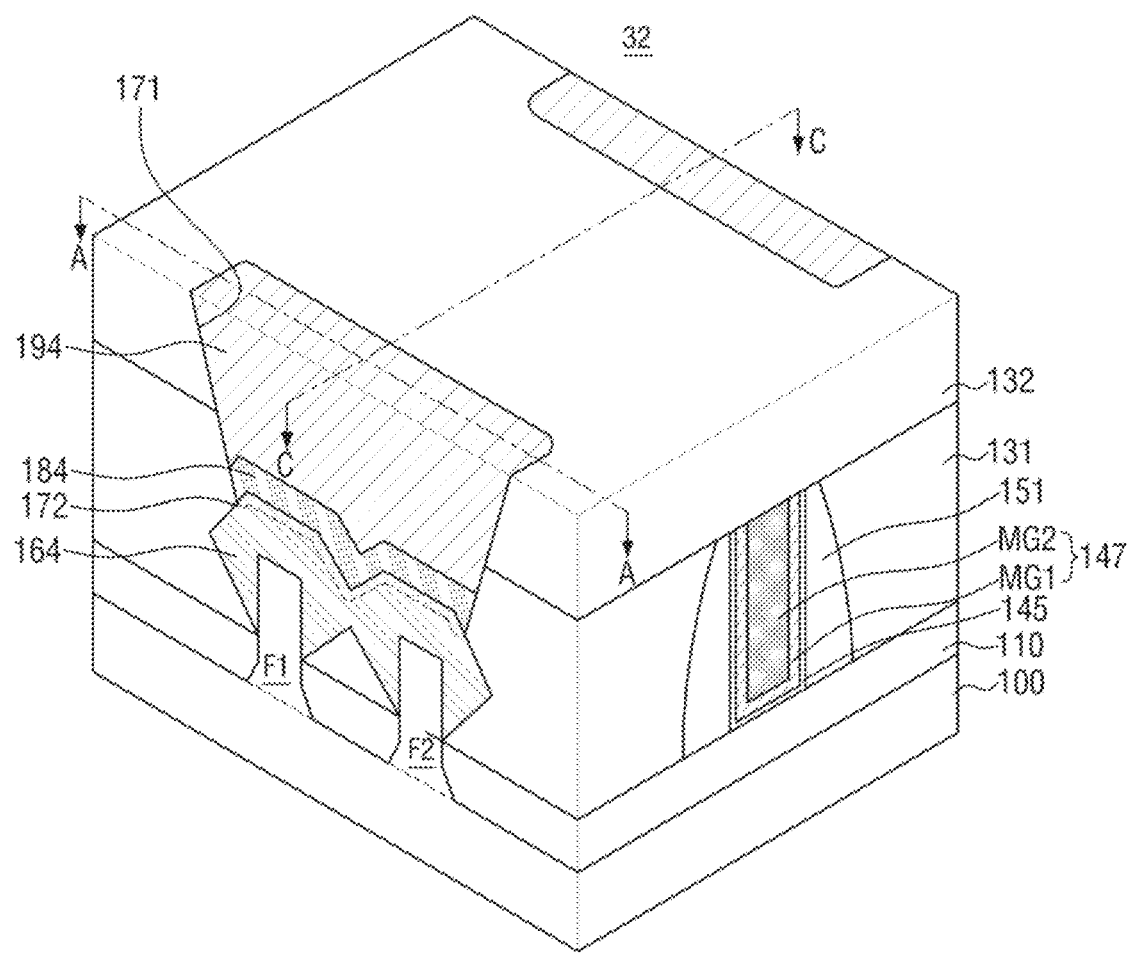
FIG. 14 is a perspective view of a semiconductor device according to a sixth exemplary embodiment.
Figure 15:
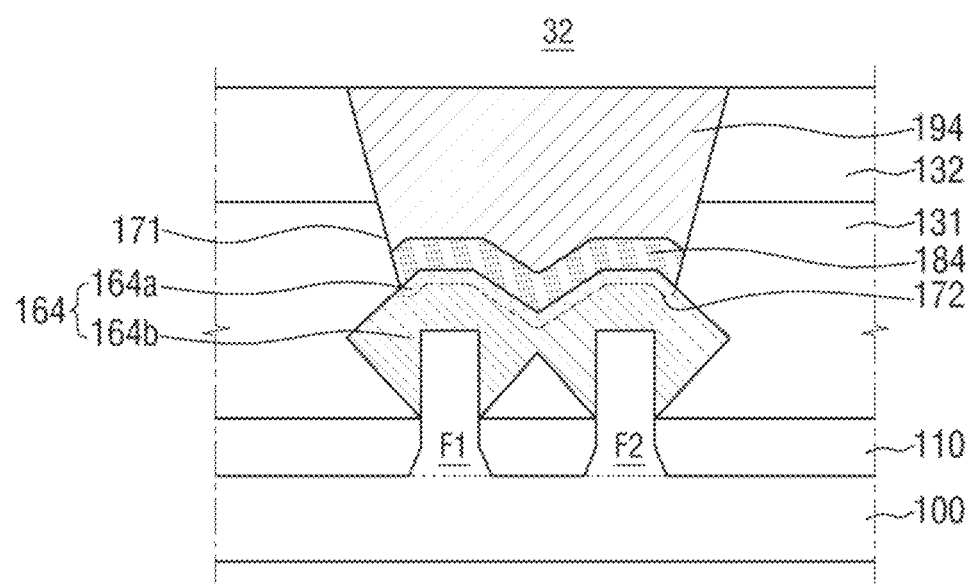
FIGS. 15 and 16 are cross-sectional views of the exemplary semiconductor device of FIG. 14, taken along the lines A-A and C-C, respectively.
Figure 16:
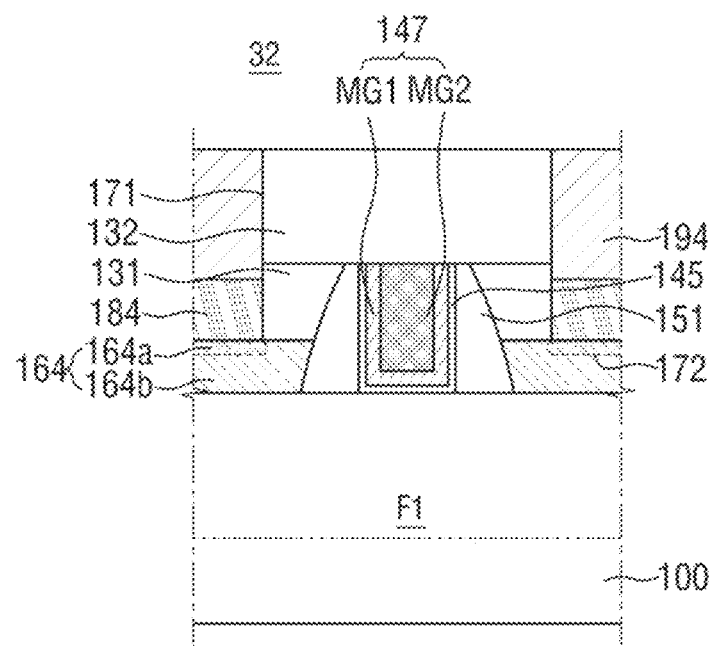

FIG. 14 is a perspective view of a semiconductor device 32 according to a sixth exemplary embodiment. FIGS. 15 and 16 are cross-sectional views of the semiconductor device 32 of FIG. 14, taken along the lines A-A and C-C, respectively. For simplicity, a description of elements substantially identical to those of the previous exemplary embodiments will be omitted, and the current embodiment will now be described, focusing mainly on differences with the previous embodiments.

Referring to FIGS. 14 through 16, the semiconductor device 32 according to the sixth exemplary embodiment may include a substrate 100, a first fin F1, a second fin F2, a gate electrode 147, a spacer 151, an epitaxial layer 164, a metal alloy layer 184, and a contact 194.

The epitaxial layer 164 may be formed on the first fin F1 and the second fin F2 on both sides of the gate electrode 147. The epitaxial layer 164 may have various shapes. For example, the epitaxial layer 164 may have a polygonal shape as illustrated in FIG. 14. The epitaxial layer 164 may surround an upper part of each of the first fin F1 and the second fin F2. For example, the epitaxial layer 164 may contact sidewalls and upper surfaces of the first and second fins F1 and F2. However, the exemplary embodiments are not limited thereto. In addition, the epitaxial layer 164 may contact the metal alloy layer 184. The epitaxial layer 164 may operate as a source or drain of the semiconductor device 32.

In addition, in certain embodiments, the epitaxial layer 164 may include a first region 164a and a second region 164b. The first region 164a of the epitaxial layer 164 may be disposed under the metal alloy layer 184. The second region 164b may be a region of the epitaxial layer 164 excluding the first region 164a. The first region 164a may have a higher doping concentration than the second region 164b.

The first region 164a may be formed to have a higher doping concentration than the second region 164b by a low-energy IIP, PLAD, or GPD process. The above doping process may use a mixed gas that contains B18 or B36. In addition, the first region 164a may be formed to a depth of 1 to 2 nm by the low-energy doping process, but the exemplary embodiments are not limited thereto.

In addition, the first region 164a of the epitaxial layer 164 may contact the metal alloy layer 184. Since the first region 164a of the epitaxial layer 164 may have a higher doping concentration than the second region 164b, Fermi level pinning (FLP) between the metal alloy layer 184 and the epitaxial layer 164 may be reduced. In addition, the SBH may be reduced, and the SCE may be improved. Accordingly, the performance of the semiconductor device 32 may be improved.

The metal alloy layer 184 may be formed on the epitaxial layer 164. The metal alloy layer 184 may contact part of the epitaxial layer 164. The first region 164a of the epitaxial layer 164 may be formed only under the metal alloy layer 184. The metal alloy layer 184 may be located only under the contact 194. As illustrated in FIG. 15, the metal alloy layer 184 may be formed to a uniform thickness along an upper surface of the epitaxial layer 164, but the exemplary embodiments are not limited thereto.

The metal alloy layer 184 may include silicide. In some embodiments, the metal alloy layer 184 may include, but not limited to, Ti or Co.

In some embodiments, the contact 194 may electrically connect a wiring to the epitaxial layer 164. The contact 194 may be made of, but not be limited to, Al, Cu, or W. The contact 194 may penetrate through a first interlayer insulating film 131 and a second interlayer insulating film 132. For example, as illustrated in FIG. 16, an upper surface of the first interlayer insulating film 131 may lie in the same plane with an upper surface of the gate electrode 147. The second interlayer insulating film 132 may cover the gate electrode 147. Each of the first interlayer insulating film 131 and the second interlayer insulating film 132 may include at least one of an oxide layer, a nitride layer and an oxynitride layer.

Referring to FIG. 16, the spacer 151 may be formed on at least one sidewall of the gate electrode 147. For example, the spacer 151 may be formed on both sidewalls of the gate electrode 147.

The epitaxial layer 164 may contact a sidewall of the spacer 151 and a lower surface of the metal alloy layer 184.

The metal alloy layer 184 may be separated from the spacer 151. That is, in some embodiments, the first interlayer insulating film 131 may be disposed between the metal alloy layer 184 and the spacer 151. An upper surface of the metal alloy layer 184 may be lower than the upper surface of the first interlayer insulating film 131. In addition, the area of the upper surface of the metal alloy layer 184 may be smaller than that of the upper surface of the epitaxial layer 164. However, the exemplary embodiments are not limited thereto.

The metal alloy layer 184 may be located under the contact 194, and the entire upper surface of the metal alloy layer 184 may contact the entire lower surface of the contact 194.

The metal alloy layer 184 may directly contact the epitaxial layer 164 and the contact 194. The first region 164a of the epitaxial layer 164 which directly contacts the metal alloy layer 184 may have a higher doping concentration than the second region 164b. Therefore, the semiconductor device 32 may have the SBH reduced and the SCE improved at an interface between the metal alloy layer 184 and the epitaxial layer 164. Accordingly, the performance of the semiconductor device 32 may be improved.

Figure 17:
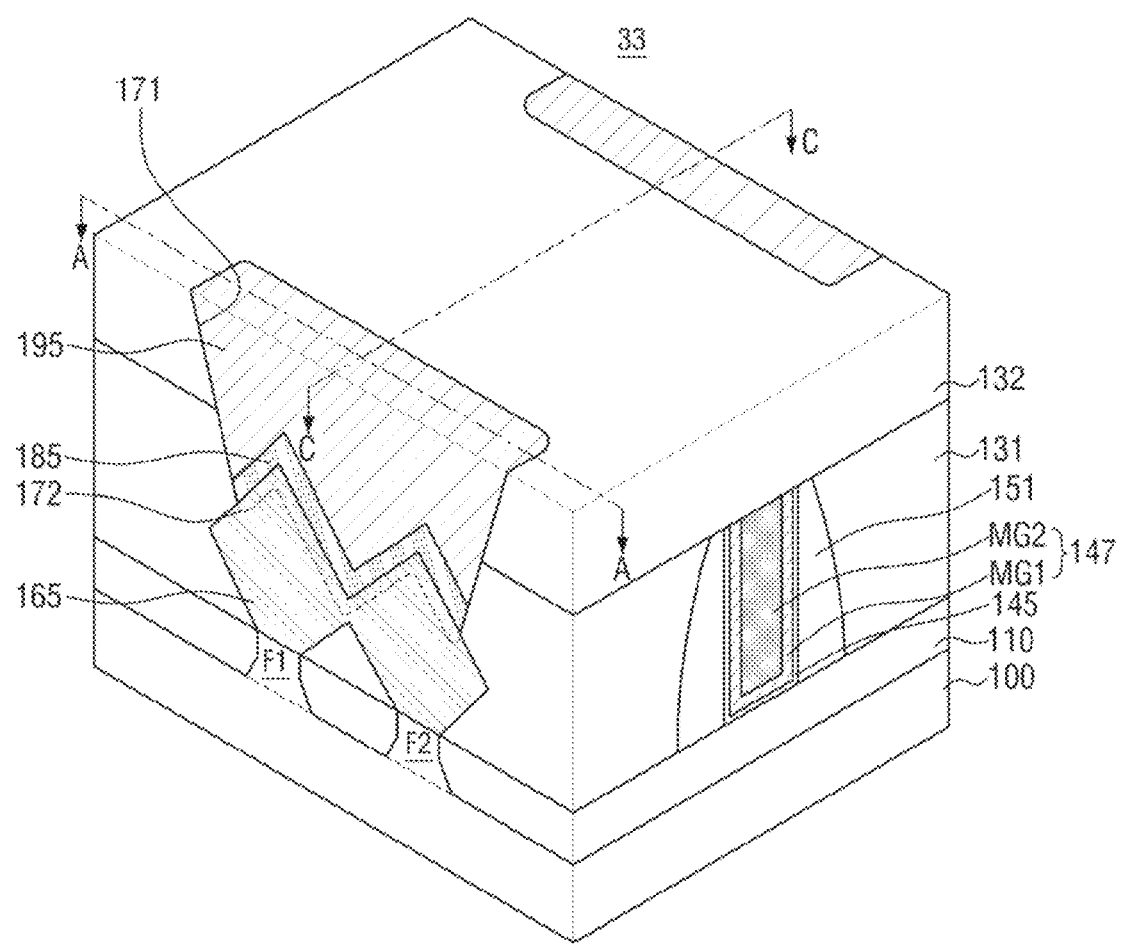
FIG. 17 is a perspective view of a semiconductor device according to a seventh exemplary embodiment.
Figure 18:
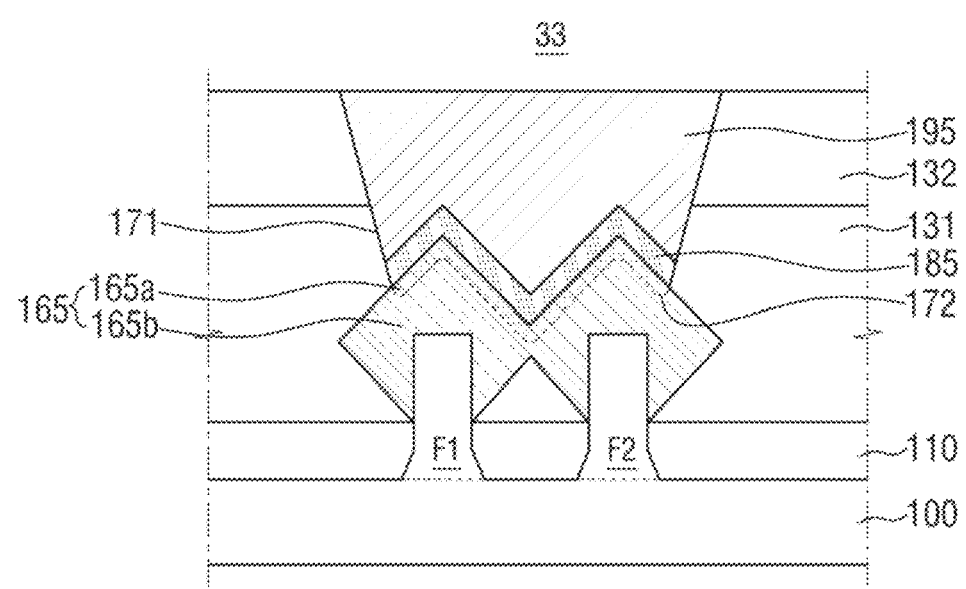
FIGS. 18 and 19 are cross-sectional views of the exemplary semiconductor device of FIG. 17, taken along the lines A-A and C-C, respectively.
Figure 19:
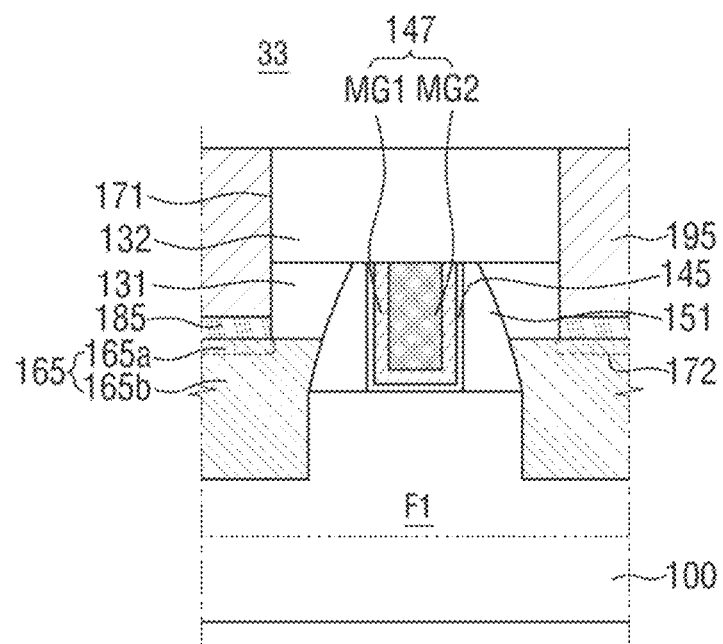

FIG. 17 is a perspective view of a semiconductor device 33 according to a seventh exemplary embodiment. FIGS. 18 and 19 are cross-sectional views of the semiconductor device 33 of FIG. 17, taken along the lines A-A and C-C, respectively. For simplicity, a description of elements substantially identical to those of the previous exemplary embodiments will be omitted, and the current embodiment will now be described, focusing mainly on differences with the previous embodiments.

Referring to FIGS. 17 through 19, the semiconductor device 33 according to the seventh exemplary embodiment may include a substrate 100, a first fin F1, a second fin F2, a gate electrode 147, a spacer 151, an epitaxial layer 165, a metal alloy layer 185, and a contact 195.

The epitaxial layer 165 may be formed on the first fin F1 and the second fin F2 on both sides of the gate electrode 147. The epitaxial layer 165 may have various shapes. For example, the epitaxial layer 165 may have a diamond shape as illustrated in FIG. 17. However, the exemplary embodiments are not limited thereto, and the epitaxial layer 165 may have at least one of a diamond shape, a circular shape, and a rectangular shape.

The epitaxial layer 165 may contact only an upper surface of each of the first fin F1 and the second fin F2. For example, the epitaxial layer 165 may contact the metal alloy layer 185. The epitaxial layer 165 may operate as a source or drain of the semiconductor device 33.

In addition, the epitaxial layer 165 may include a first region 165a and a second region 165b. The first region 165a of the epitaxial layer 165 may be disposed under the metal alloy layer 185. The second region 165b may be a region of the epitaxial layer 165 excluding the first region 165a. The first region 165a may have a higher doping concentration than the second region 165b. The first region 165a may be formed to have a higher doping concentration than the second region 165b by a low-energy IIP, PLAD, or GPD process. The above doping process may use a mixed gas that contains B18 or B36. In addition, the first region 165a may be formed to a depth of 1 to 2 nm by the low-energy doping process, but the exemplary embodiments are not limited thereto.

In addition, the first region 165a of the epitaxial layer 165 may contact the metal alloy layer 185. Since the first region 165a of the epitaxial layer 165 has a higher doping concentration than the second region 165b, the FLP between the metal alloy layer 185 and the epitaxial layer 165 may be reduced. In addition, the SBH may be reduced, and the SCE may be improved. Accordingly, the performance of the semiconductor device 33 may be improved.

The metal alloy layer 185 may be formed on the epitaxial layer 165. The metal alloy layer 185 may contact part of the epitaxial layer 165. The first region 165a of the epitaxial layer 165 may be formed only under the metal alloy layer 185. The metal alloy layer 185 may be located only under the contact 195. As illustrated in FIG. 17, the metal alloy layer 185 may be formed to a uniform thickness along an upper surface of the epitaxial layer 165, but the exemplary embodiments are not limited thereto.

The metal alloy layer 185 may include silicide. In some embodiments, the metal alloy layer 185 may include, but not limited to, Ti or Co.

Referring to FIG. 19, the spacer 151 may be formed on at least one sidewall of the gate electrode 147. For example, the spacer 151 may be formed on both sidewalls of the gate electrode 147.

The epitaxial layer 165 may contact a sidewall of the spacer 151 and a lower surface of the metal alloy layer 185. In addition, the epitaxial layer 165 may contact a sidewall of the first fin F1. A lower surface of the epitaxial layer 165 may be lower than an upper surface of the first fin F1 which is overlapped by the gate electrode 147.

The metal alloy layer 185 may be separated from the spacer 151. That is, a first interlayer insulating film 131 may be disposed between the metal alloy layer 185 and the spacer 151. An upper surface of the metal alloy layer 185 may be lower than an upper surface of the first interlayer insulating film 131. In addition, the area of the upper surface of the metal alloy layer 185 may be smaller than that of the upper surface of the epitaxial layer 165. However, the exemplary embodiments are not limited thereto.

The metal alloy layer 185 may be located under the contact 195, and the entire upper surface of the metal alloy layer 185 may contact the entire lower surface of the contact 195.

The metal alloy layer 185 may directly contact the epitaxial layer 165 and the contact 195. The first region 165a of the epitaxial layer 165 which directly contacts the metal alloy layer 185 may have a higher doping concentration than the second region 165b. Therefore, the semiconductor device 33 may have the SBH reduced and the SCE improved at an interface between the metal alloy layer 185 and the epitaxial layer 165. Accordingly, the performance of the semiconductor device 33 may be improved.

Figure 20:
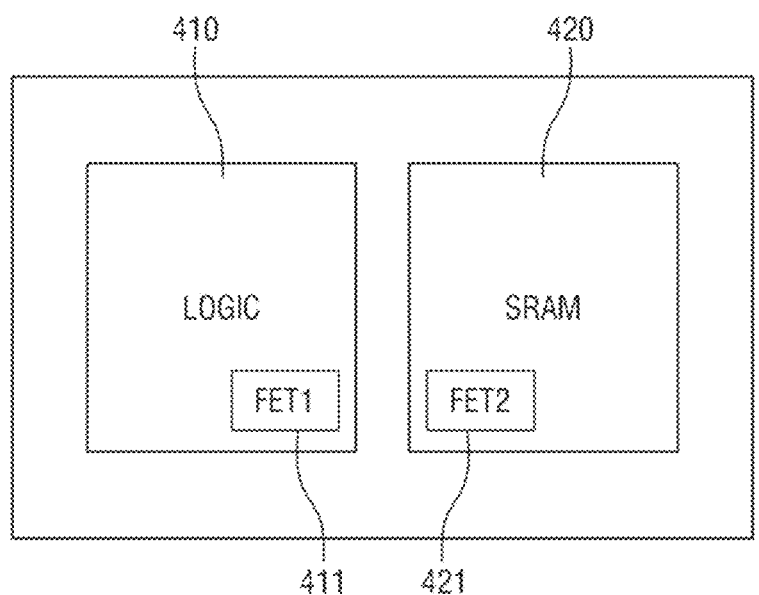
FIG. 20 illustrates a semiconductor device according to some exemplary embodiments.
Figure 21:
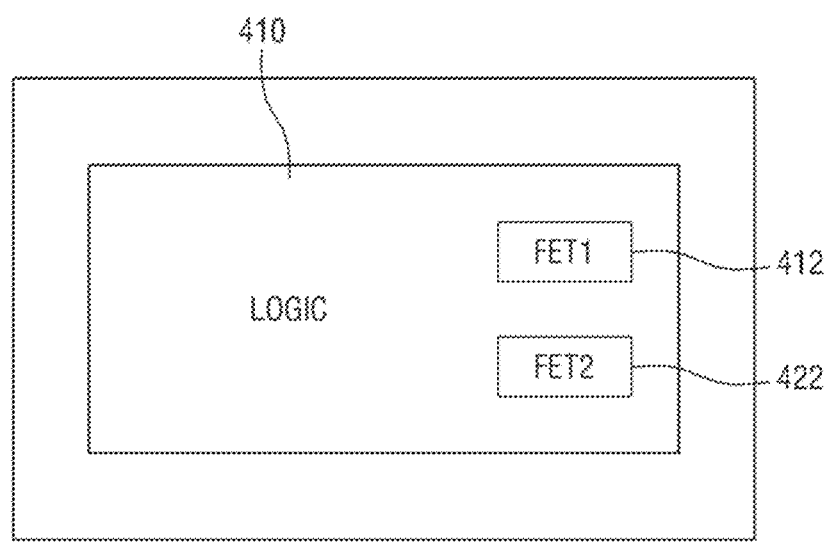
FIG. 21 illustrates a semiconductor device according to other exemplary embodiments.

FIG. 20 illustrates a semiconductor device 13 according to certain exemplary embodiments. FIG. 21 illustrates a semiconductor device 14 according to other exemplary embodiments. For simplicity, a description of elements substantially identical to those of the previous embodiments will be omitted, and the current embodiments will now be described, focusing mainly on differences with the pervious embodiments.

Referring to FIG. 20, the semiconductor device 13 may include a logic region 410 and a static random access memory (SRAM) region 420. An eleventh transistor 411 may be disposed in the logic region 410, and a twelfth transistor 421 may be disposed in the SRAM region 420. For example, the eleventh transistor 411 and the twelfth transistor 421 may be the semiconductor devices 10, 11, 21, 22 and 33 through 33 according to the previous exemplary embodiments.

In some embodiments, the eleventh transistor 411 and the twelfth transistor 421 may have different conductivity types. For example, if an NMOS transistor is employed as the eleventh transistor 411, a PMOS transistor may be employed as the twelfth transistor 421. In some other embodiments, the eleventh transistor 411 and the twelfth transistor 421 may have the same conductivity type.

Referring to FIG. 21, the semiconductor device 14 may include a logic region 410. Thirteenth and fourteenth transistors 412 and 422 which are different from each other may be disposed in the logic region 410. Although not specifically illustrated in the drawing, the thirteenth and fourteenth transistors 412 and 422 which are different from each other may also be disposed in an SRAM region.

In FIG. 21, the logic region 410 and the SRAM region are illustrated as an example, but the exemplary embodiments are not limited to this example. The exemplary embodiments may also applicable to the logic region 410 and a region where another memory (e.g., DRAM, MRAM, RRAM, PRAM, etc.) is formed.

Figure 22:
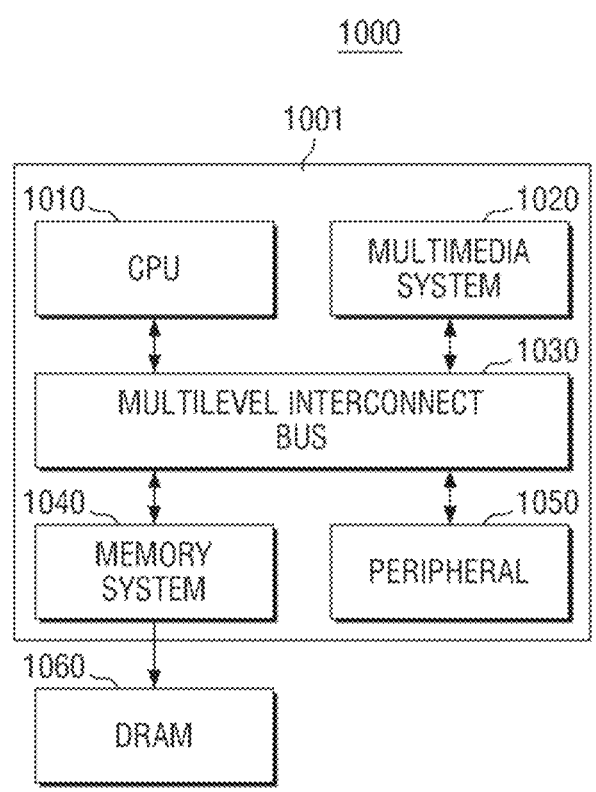
FIG. 22 is a block diagram of a system-on-chip (SoC) system including semiconductor devices according to some exemplary embodiments.

FIG. 22 is a block diagram of a system-on-chip (SoC) system 1000 including semiconductor devices according to certain exemplary embodiments.

Referring to FIG. 22, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations to drive the SoC system 1000. In some embodiments, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The bus 1030 may be used for data communication among the CPU 1010, the multimedia system 1020, the memory system 1040 and the peripheral circuit 1050. In some embodiments, the bus 1030 may have a multilayer structure. In some embodiments, the bus 1030 may be, but is not limited to, a multilayer advanced high-performance bus (AHB) or a multilayer advanced extensible interface (AXI).

The memory system 1040 may provide an environment appropriate for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment appropriate for the SoC system 1000 to smoothly connect to an external device (e.g., mainboard). For example, the peripheral circuit 1050 may include various interfaces that enable the external device connected to the SoC system 1000 to be compatible with the SoC system 1000.

The DRAM 1060 may function as a working memory allowing for the operation of the application processor 1001. In some embodiments, the DRAM 1060 may be placed outside the application processor 1001 as illustrated in the drawing. For example, the DRAM 1060 may be packaged with the application processor 1001 in the form of package on package (PoP).

At least one of the elements of the SoC system 1000 may employ any one of the semiconductor devices 10, 11, 21, 22 and 31 through 33 according to the above-described exemplary embodiments.

Figure 23:
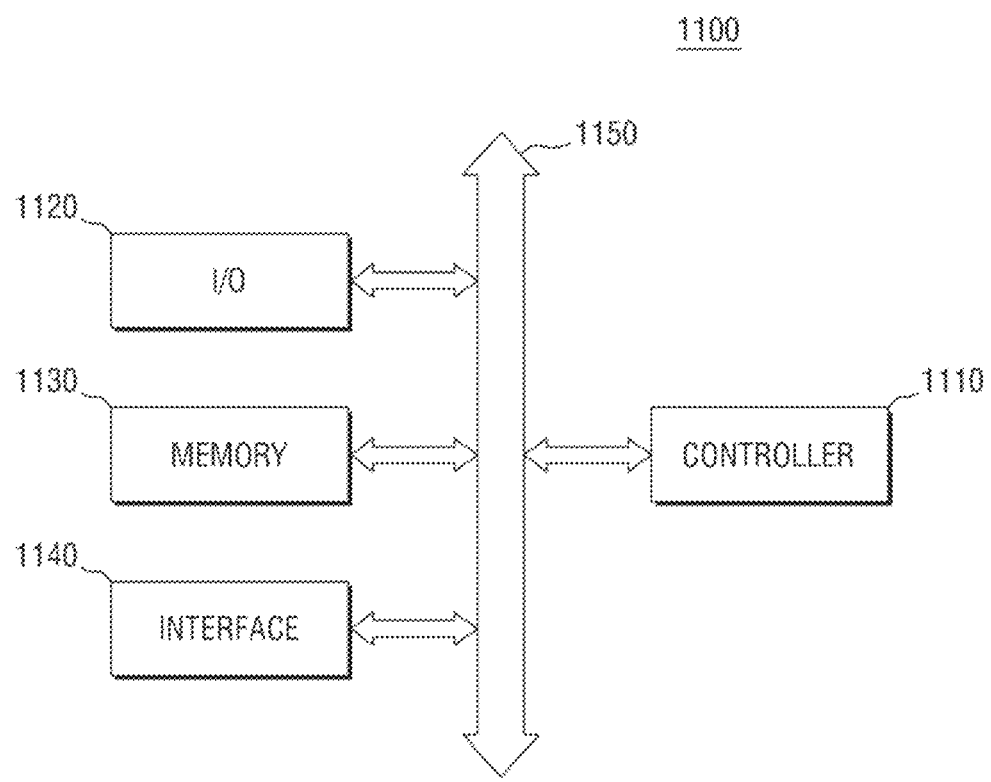
FIG. 23 is a block diagram of an electronic system including semiconductor devices according to certain exemplary embodiments.

FIG. 23 is a block diagram of an electronic system 1100 including semiconductor devices according to certain exemplary embodiments.

Referring to FIG. 23, the electronic system 1100 may include a controller 1110, an input-output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The 1/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be a working memory for improving the operation of the controller 1110, and may further include a high-speed DRAM or SRAM. Here, any one of the semiconductor devices 10, 11, 21, 22 and 31 through 33 according to the above-described exemplary embodiments may be employed as the working memory. In addition, any one of the semiconductor devices 10, 11, 21, 22 and 31 through 33 according to the above-described embodiments may be provided in the memory device 1130 or in the controller 1110 or the I/O device 1120.

The electronic system 1100 may be applied to nearly all types of electronic products capable of transmitting and/or receiving information in a wireless environment, such as a personal data assistant (PDA), a portable computer, a web tablet, a wireless phone, a mobile phone, a digital music player, a memory card, etc.

Figure 24:
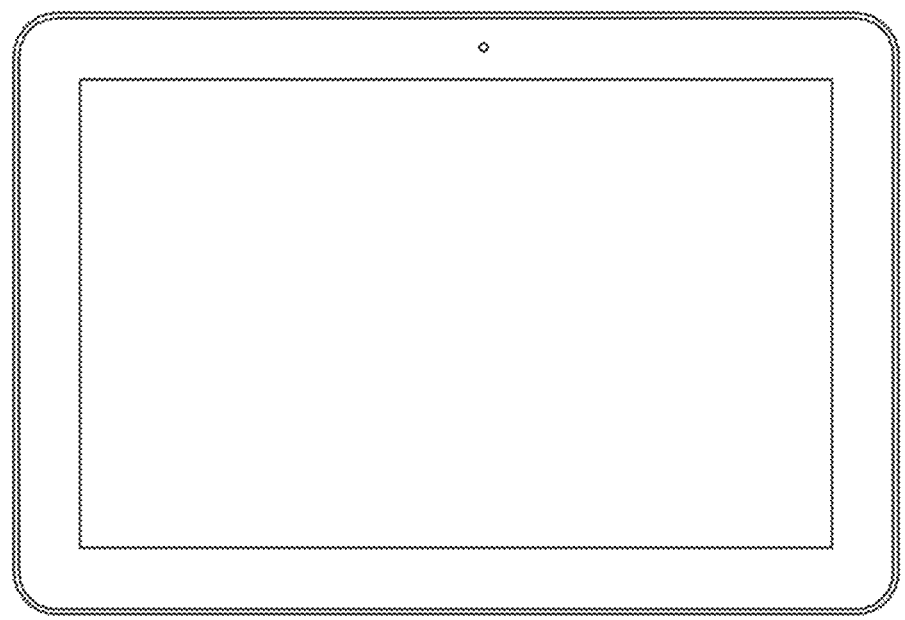
FIGS. 24 through 26 are diagrams illustrating examples of a semiconductor system to which semiconductor devices according to some exemplary embodiments may be applied.
Figure 25:
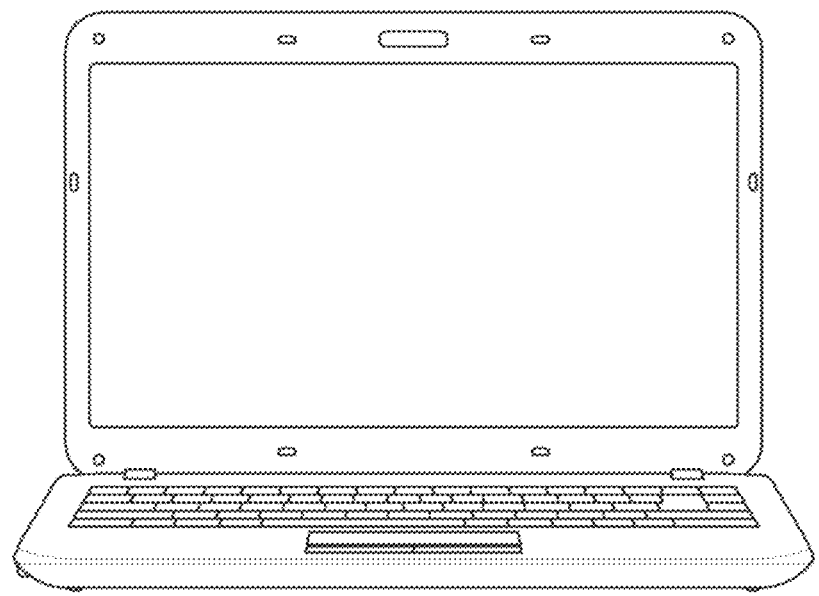
Figure 26:
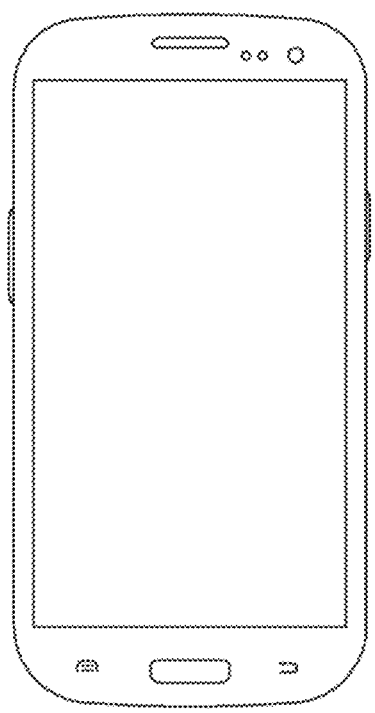

FIGS. 24 through 26 are diagrams illustrating examples of a semiconductor system to which semiconductor devices according to certain exemplary embodiments may be applied.

FIG. 24 illustrates a tablet personal computer (PC) 1200, FIG. 25 illustrates a notebook computer 1300, and FIG. 26 illustrates a smartphone 1400. At least one of the semiconductor devices 10, 11, 21, 22 and 31 through 33 according to the above-described exemplary embodiments, as set forth herein, may be used in the tablet PC 1200, the notebook computer 1300, and the smartphone 1400.

The semiconductor devices 10, 11, 21, 22 and 31 through 33 according to the above-described exemplary embodiments, as set forth herein, may also be applied to various IC devices other than those set forth herein. That is, while the tablet PC 1200, the notebook computer 1300, and the smartphone 1400 have been described above as examples of a semiconductor system according to an exemplary embodiment, the examples of the semiconductor system according to the embodiment are not limited to the tablet PC 1200, the notebook computer 1300, and the smartphone 1400. In some embodiments, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

A method of fabricating a semiconductor device according to certain exemplary embodiments will now be described with reference to FIGS. 27 through 37.

FIGS. 27 through 37 are views illustrating steps of a method of fabricating a semiconductor device according to exemplary embodiments. The semiconductor device 10 according to the first exemplary embodiment of FIGS. 1 through 4 will hereinafter be described as an example.

Figure 27:
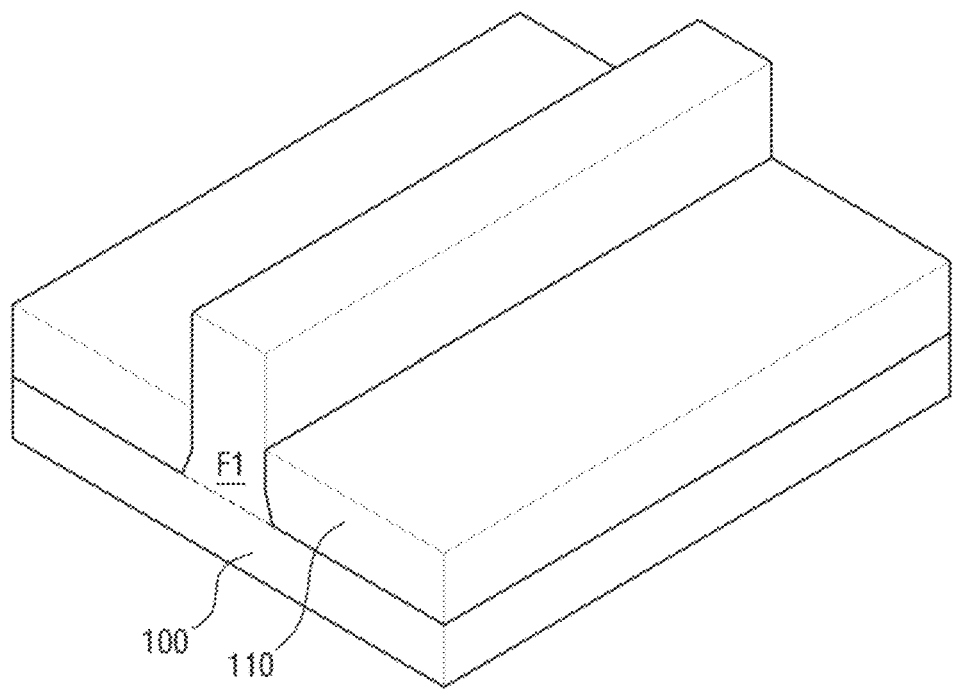
FIGS. 27 through 37 are views illustrating example steps of methods of fabricating a semiconductor device according to certain disclosed embodiments.

Referring to FIG. 27, a first fin F1 is formed on a substrate 100.

In some embodiments, for example, after a mask pattern is formed on the substrate 100, an etching process is performed to form the first fin F1. The first fin F1 may extend along a first direction. Next, a device isolation layer 110 is formed on an upper surface of the substrate 100 and a lower part of the first fin F1. The device isolation layer 110 may be made of a material including at least one of a silicon oxide layer, a silicon nitride layer and a silicon oxynitride layer.

A part of the first fin F1 which protrudes further upward than the device isolation layer 110 may be formed by an epitaxy process. For example, after the formation of the device isolation layer 110, a part of the first fin F1 may be formed not by a recess process but by an epitaxy process using an upper surface of the first fin F1, which is exposed by the device isolation layer 110, as a seed.

In addition, a doping process for adjusting a threshold voltage may be performed on the first fin F1. If the semiconductor device 10 is an NMOS transistor, boron (B) may be used as a dopant. If the semiconductor device 10 is a PMOS transistor, the dopant may be phosphorous (P) or arsenic (As).

Figure 28:
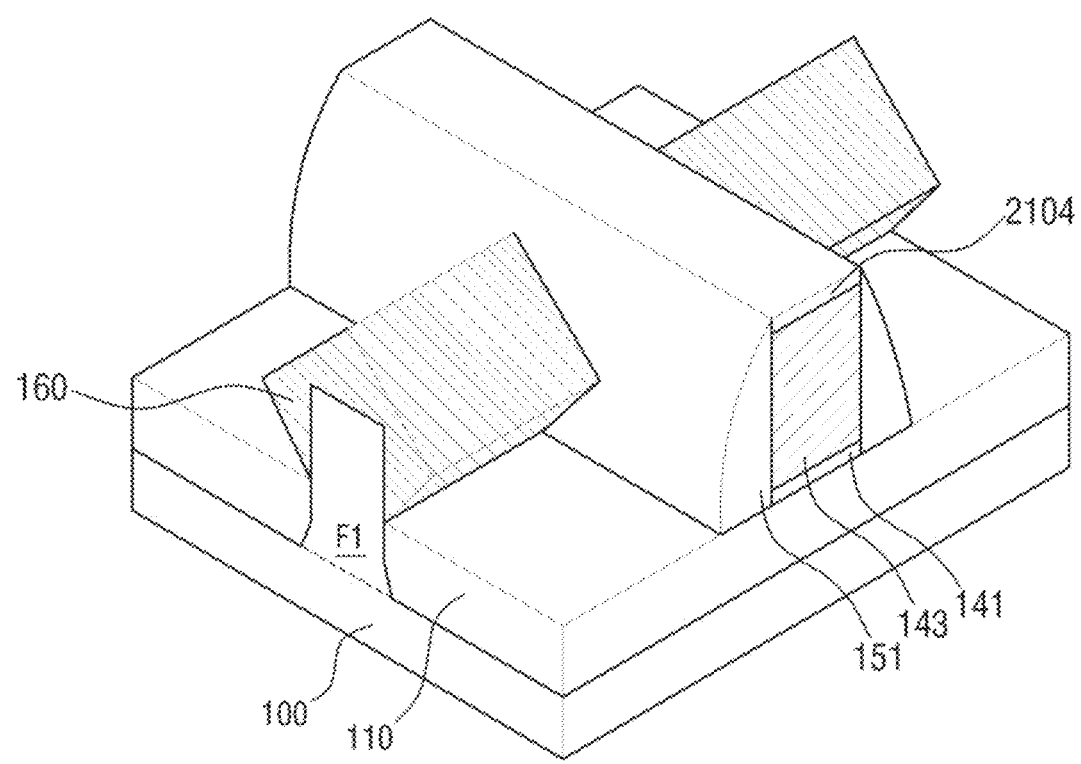

Referring to FIG. 28, an etching process may be performed using a mask pattern 2104, thereby forming a dummy gate insulating layer 141 and a dummy gate electrode 143 which extend along a second direction to intersect the first fin F1. For example, the dummy gate insulating layer 141 may be a silicon oxide layer, and the dummy gate electrode 143 may be polysilicon.

Next, a spacer 151 may be formed on at least one side of the dummy gate electrode 143. The spacer 151 may be formed on sidewalls of the dummy gate electrode 143 and expose an upper surface of the mask pattern 2104. The spacer 151 may be a silicon nitride layer or a silicon oxynitride layer.

An epitaxial layer 160 may be formed on both sides of the dummy gate electrode 143. The epitaxial layer 160 may be formed by an epitaxy process. The material of the epitaxial layer 160 may vary according to whether the semiconductor device 10 according to the first exemplary embodiment is an n-type transistor or a p-type transistor. Therefore, in some embodiments, a dopant may be in-situ doped in the epitaxy process. The epitaxial layer 160 may have at least one of a diamond shape, a circular shape and a rectangular shape.

Figure 29:
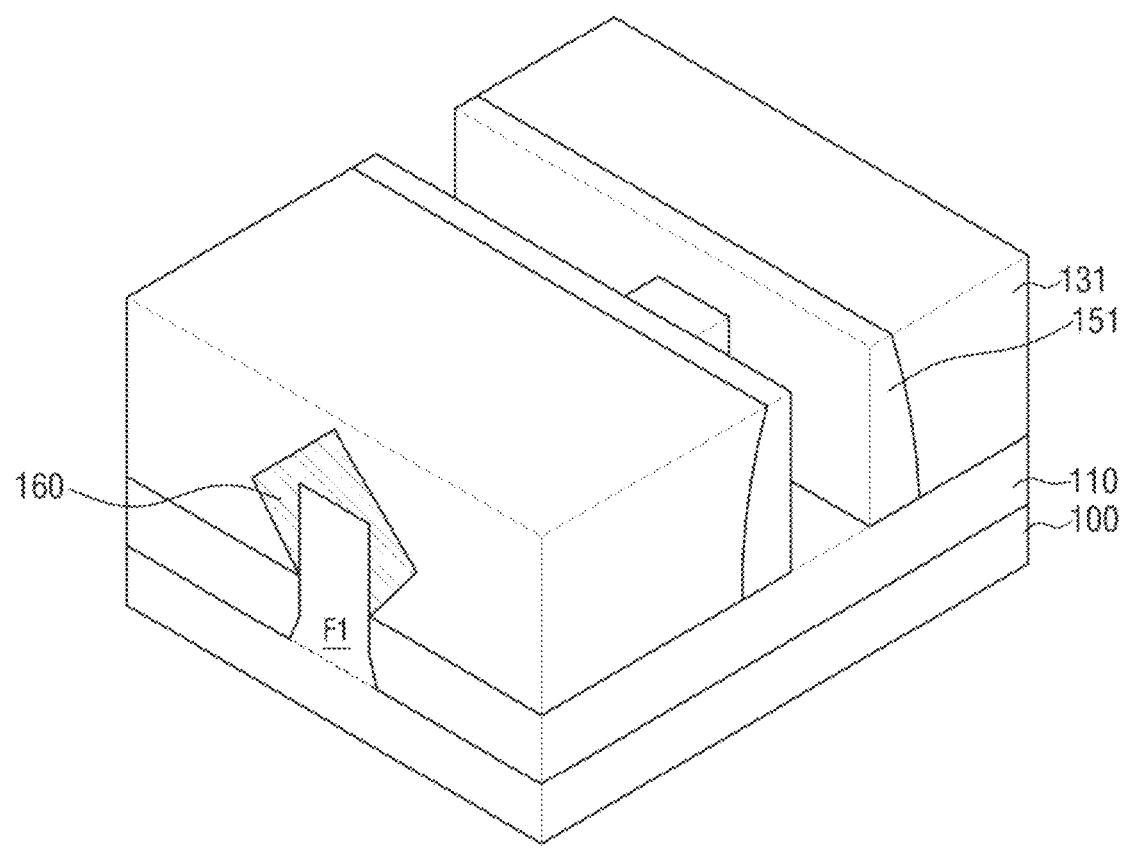

Referring to FIG. 29, a first interlayer insulating film 131 may be formed on the resultant structure of FIG. 28. The first interlayer insulating film 131 may be at least one of, e.g., an oxide layer, a nitride layer, and an oxynitride layer.

The first interlayer insulating film 131 may be planarized until an upper surface of the dummy gate electrode 143 is exposed. As a result, the mask pattern 2104 may be removed, and the upper surface of the dummy gate electrode 143 may be exposed.

Next, the dummy gate insulating layer 141 and the dummy gate electrode 143 may be removed. The removal of the dummy gate insulating layer 141 and the dummy gate electrode 143 results in the formation of a trench 123 which exposes the device isolation layer 110.

Figure 30:
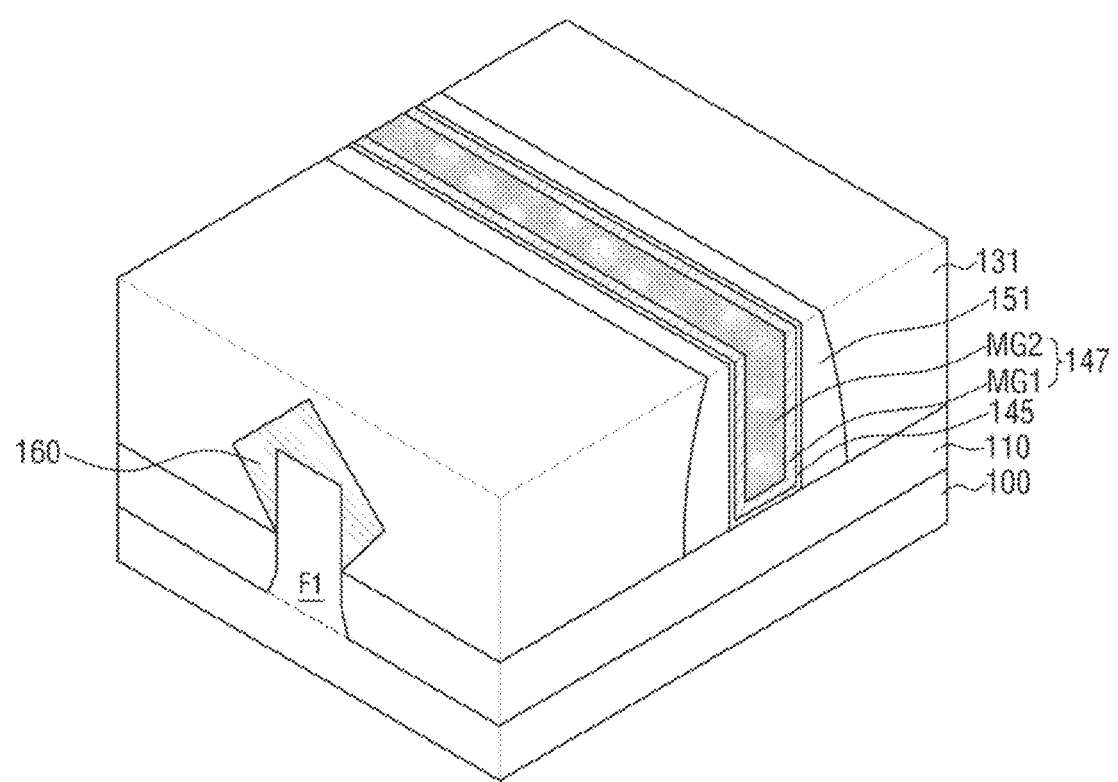

Referring to FIG. 30, a gate insulating layer 145 and a gate electrode 147 may be formed in the trench 123.

The gate insulating layer 145 may include a high-k material having a higher dielectric constant than a silicon oxide layer. For example, the gate insulating layer 145 may include $HfO_2$, $ZrO_2$, or $Ta_2O_5$. The gate insulating layer 145 may be formed substantially conformally along sidewalls and a lower surface of the trench 123.

The gate electrode 147 may include metal layers (MG1, MG2). As illustrated in the drawing, the gate electrode 147 may be formed by stacking two or more metal layers (MG1, MG2). A first metal layer MG1 may control a work function, and a second metal layer MG2 may fill a space formed by the first metal layer MG1. For example, the first metal layer MG1 may include at least one of TiN, TaN, TiC, and TaC. In addition, the second metal layer MG2 may include W or Al. Alternatively, the gate electrode 147 may be made of a material (e.g., Si or SiGe) other than a metal.

Figure 31:
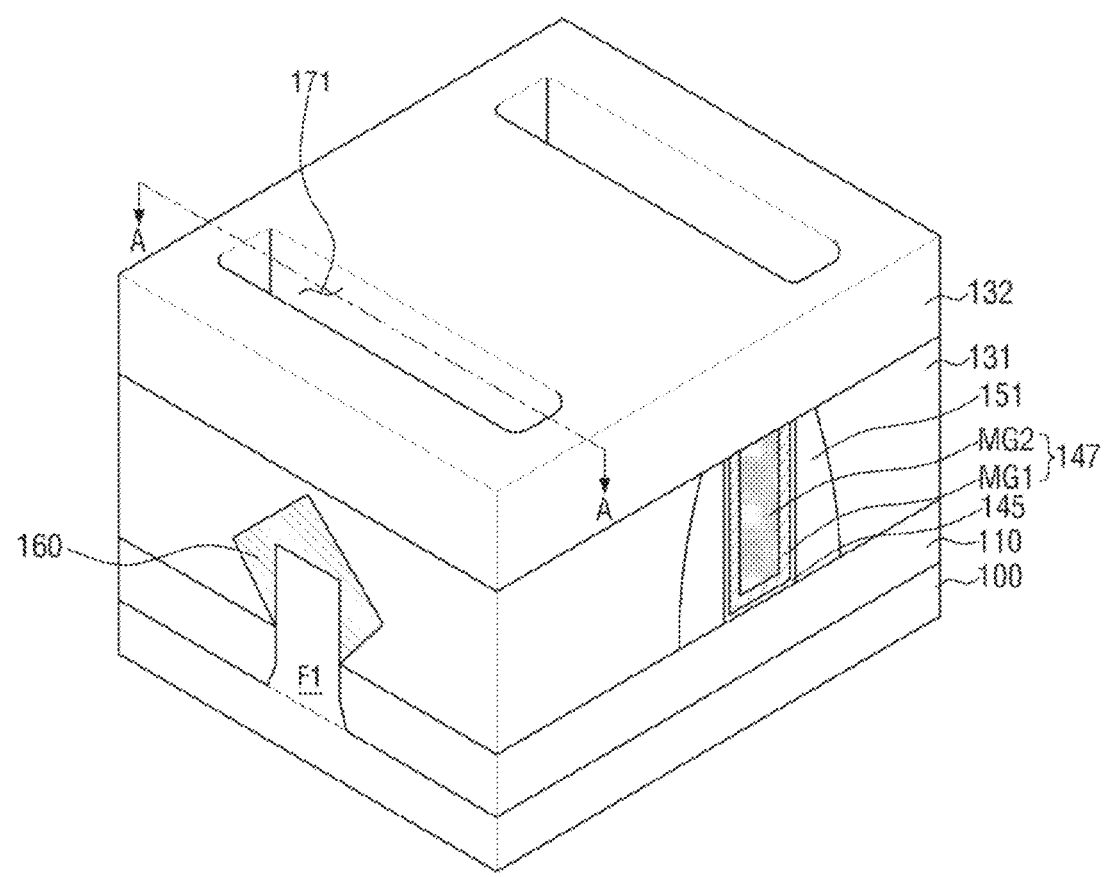

Referring to FIG. 31, a second interlayer insulating film 132 may be formed on the resultant structure of FIG. 30. The second interlayer insulating film 132 may be at least one of, e.g., an oxide layer, a nitride layer, and an oxynitride layer.

Next, a contact recess 171 may be formed to penetrate through the first interlayer insulating film 131 and the second interlayer insulating film 132 and expose part of the epitaxial layer 160 and part (i.e., the upper surface) of the first fin F1.

Figure 32:
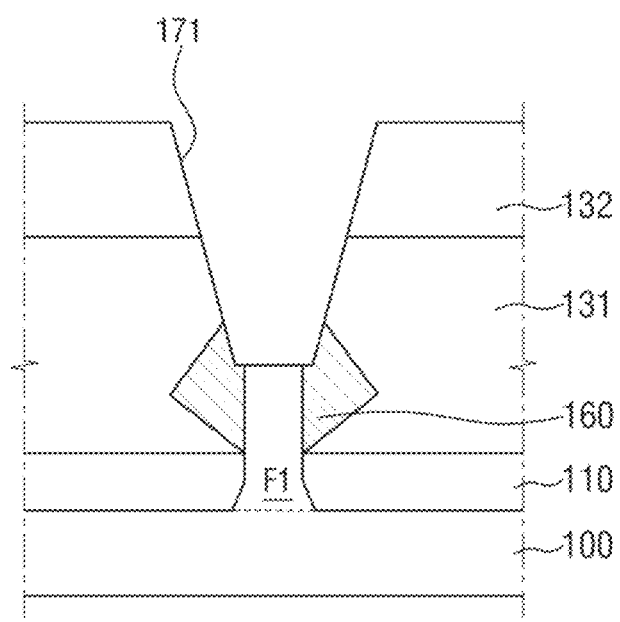

FIG. 32 is a cross-sectional view taken along the line A-A of FIG. 31.

Referring to FIG. 32, the contact recess 171 may be formed to penetrate through the first interlayer insulating film 131 and the second interlayer insulating film 132 and expose part of the epitaxial layer 160 or the upper surface of the first fin F1. As illustrated in FIG. 32, in some embodiments, the contact recess 171 may have a tapered cross-sectional shape that becomes wider from the top toward the bottom. However, the cross-sectional shape of the contact recess 171 is not limited to the tapered shape. In some embodiments, the contact recess 171 may have a quadrilateral cross-sectional shape.

Figure 33:
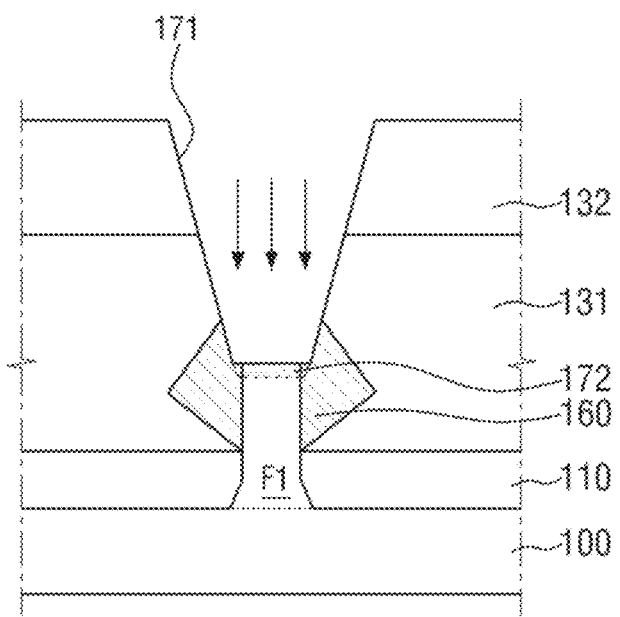

Referring to FIG. 33, the upper surface of the first fin F1 or part of the epitaxial layer 160 which is exposed by the contact recess 171 may be doped with a dopant by a low-energy IIP, PLAD, or GPD process. Thus, for example, a region exposed by the contact recess 171 has a higher doping concentration than its surrounding region. The above doping process may use a mixed gas that contains B18 or B36. In addition, a doping region 172 may be formed to a depth of 1 to 2 nm by the low-energy doping process, but the exemplary embodiments are not limited thereto.

Figure 34:
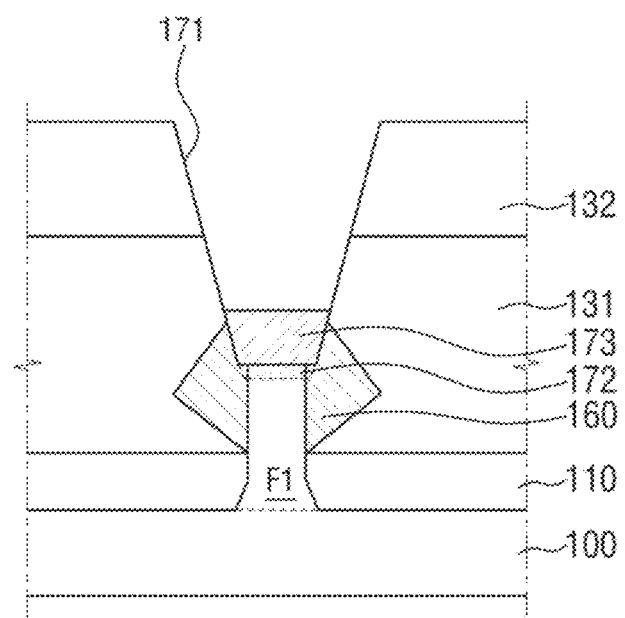

Referring to FIG. 34, a dummy epitaxial layer 173 may be formed in a lower part of the contact recess 171. The dummy epitaxial layer 173 may be formed by an epitaxy process. In addition, the material of the dummy epitaxial layer 173 may vary according to whether the semiconductor device 10 is an n-type transistor or a p-type transistor. In addition, in some embodiments, a dopant may be in-situ doped in the epitaxy process.

Figure 35:
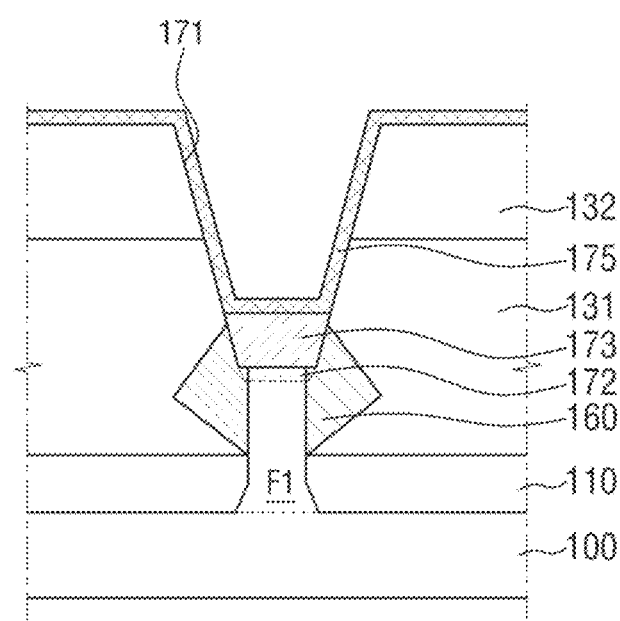

Referring to FIG. 35, a metal layer 175 may be formed on the dummy epitaxial layer 173.

In some embodiments, the metal layer 175 may be conformally formed along sidewalls of the contact recess 171 and an upper surface of the dummy epitaxial layer 173. The metal layer 175 may be formed by electroless plating. Electroless plating has excellent coverage properties. Since electroless plating has no selectivity, there may be no need to remove an unreacted metal layer after the formation of silicide (see FIG. 37). The metal layer 175 may also be formed by electro-plating. Since electro-plating has selectivity, the unreacted metal layer has to be removed after the formation of silicide.

In addition, the material of the metal layer 175 may vary according to whether the semiconductor device 10 is an n-type transistor or ap-type transistor. For example, if the semiconductor device 10 is an n-type transistor, the metal layer 175 may be, but is not limited to, Co, Cr, W, Mo, Ta, Er or NiP. If the semiconductor device 10 is ap-type transistor, the metal layer 175 may be, but is not limited to, Pt, Pd, NiB, or NiPt. Materials that can be electroless-plated or electroplated may be used as desired.

Figure 36:
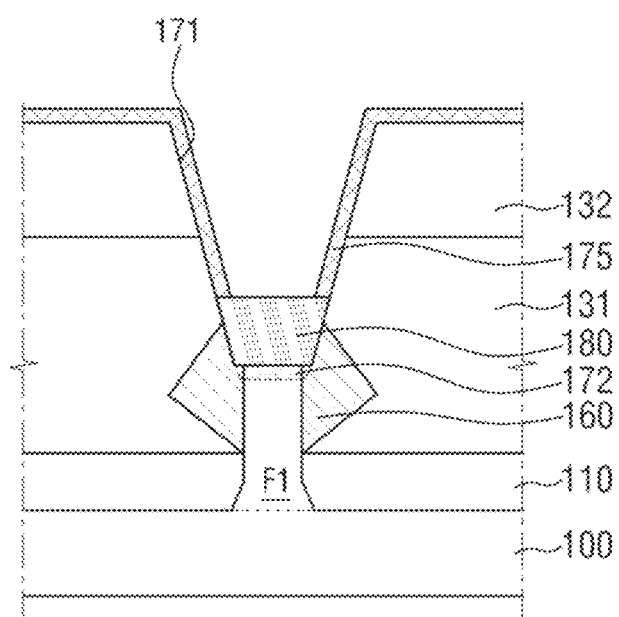

Referring to FIG. 36, the epitaxial layer 160 and the metal layer 175 may be made to react with each other by a heat treatment process, thereby forming a metal alloy layer 180 (i.e., silicide). The temperature, duration, etc. of the heat treatment process may be adjusted according to various conditions including the material of the metal layer 175 and a thickness of the metal alloy layer 180.

Figure 37:
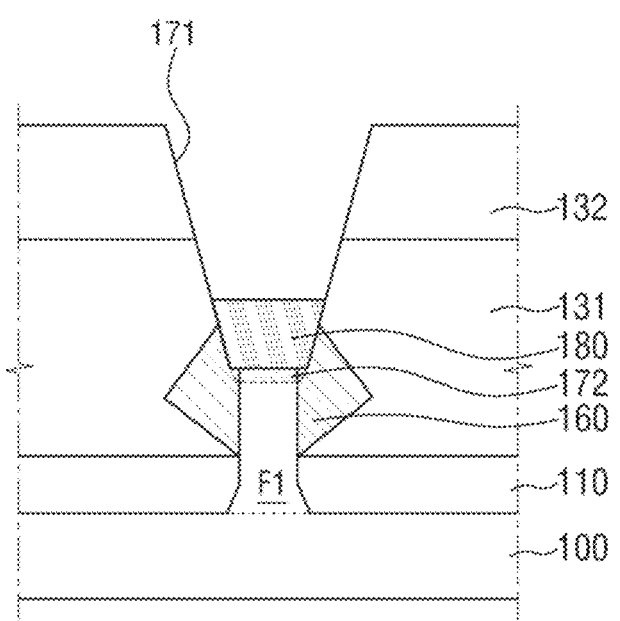

Referring to FIG. 37, a part of the metal layer 175 which failed to react in the heat treatment process may be removed.

Referring to FIG. 2, a contact 190 may be formed on the metal alloy layer 180. The contact 190 may be formed to fill the contact recess 171. Accordingly, the contact 190 may be formed to penetrate through the first interlayer insulating film 131 and the second interlayer insulating film 132, but the exemplary embodiments are not limited thereto. An upper surface of the contact 190 and an upper surface of the second interlayer insulating film 132 may be made to lie in the same plane by a planarization process (e.g., a CMP process).

While the disclosed embodiments have been particularly shown and described with reference to examples thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope.

What is claimed is:

1. A semiconductor device comprising:
   a first fin protruding from a substrate;
   a gate electrode extending in a first direction to cross the first fin;
   an epitaxial layer on both sides of the gate electrode and in contact with side surfaces of the first fin; and
   a metal alloy layer contacting an upper surface of the first fin and a part of the epitaxial layer,
   wherein a first region of the first fin including the upper surface of the first fin has a higher doping concentration than a second region of the first fin located under the first region, and
   wherein a third region of the epitaxial layer including the part of the epitaxial layer has a higher doping concentration than a fourth region of the epitaxial layer located under the third region.

2. The semiconductor device of claim 1, wherein the first region is formed only under the metal alloy layer.

3. The semiconductor device of claim 1, further comprising a spacer on at least one sidewall of the gate electrode,
   wherein the epitaxial layer contacts a sidewall of the spacer and a sidewall of the metal alloy layer, and
   wherein the metal alloy layer is separated from the spacer.

4. The semiconductor device of claim 1, further comprising a contact on the metal alloy layer, wherein the entire upper surface of the metal alloy layer contacts the entire lower surface of the contact.

5. The semiconductor device of claim 1, wherein a first doping region is formed between the first region and the second region, and
   wherein a doping concentration of the first doping region gradually increases from a bottom surface of the first doping region to a top surface of the first doping region.

6. The semiconductor device of claim 5, wherein a second doping region is formed between the third region and the fourth region, and wherein a doping concentration of the second doping region gradually increases from a bottom surface of the second doping, region to a top surface of the second doping region.

7. The semiconductor device of claim 1, further comprising:
a first interlayer insulating film on the substrate; and
a second interlayer insulating film on the first interlayer insulating film and the gate electrode,
wherein the upper surface of the metal alloy layer is lower than an upper surface of the first interlayer insulating film.

8. The semiconductor device of claim 1, wherein an upper surface of the metal alloy layer is higher than the epitaxial layer.

9. A semiconductor device comprising:
a first fin protruding from a substrate;
a gate electrode on the first fin to intersect the first fin;
an epitaxial layer surrounding the first fin on both sides of the gate electrode; and
a metal alloy layer on the epitaxial layer and the first fin,
wherein a first region of the epitaxial layer has a higher doping concentration than a second region of the epitaxial layer which is located under the first region, and
wherein the first fin has a third region located under the metal alloy layer and a fourth region located under the third region, the third region having a higher doping concentration than the fourth region.

10. The semiconductor device of claim 9, wherein an upper surface of the metal alloy layer is smaller than that of an upper surface of the epitaxial layer.

11. The semiconductor device of claim 9, further comprising spacers which are respectively formed on both sidewalls of the gate electrode, wherein the epitaxial layer contacts sidewalls of the spacers, and the metal alloy layer is separated from the sidewalls of the spacers.

12. The semiconductor device of claim 9, wherein the first region contacts the metal alloy layer.

13. The semiconductor device of claim 9,
wherein a first doping region is formed between the third region and the fourth region, and
wherein a doping concentration of the first doping region gradually increases from a bottom surface of the first doping region to a top surface of the first doping region.

14. The semiconductor device of claim 13,
wherein a second doping region is formed between the first region and the second region, and
wherein a doping concentration of the second doping region gradually increases from a bottom surface of the second doping region to a top surface of the second doping region.

15. A semiconductor device comprising:
a first fin protruding from a substrate;
a gate electrode on the first fin to intersect the first fin;
an epitaxial layer surrounding the first fin on both sides of the gate electrode;
a contact recess; and
a metal alloy layer within the contact recess contacting an upper surface of the first fin and a part of the epitaxial layer,
wherein a first region of the first fin including the upper surface of the first fin has a higher doping concentration than a second region of the first fin located under the first region,
wherein a third region of the epitaxial layer including the part of the epitaxial layer has a higher doping concentration than a fourth region of the epitaxial layer located under the third region, and
wherein the third region contacts a sidewall of the contact recess.

16. The semiconductor device of claim 15, wherein the first region contacts the metal alloy layer.

17. The semiconductor device of claim 16, wherein the first region is formed only under the metal alloy layer.

18. The semiconductor device of claim 15, wherein the third region contacts a part of the sidewall of the contact recess.

19. The semiconductor device of claim 15, wherein a first doping region is formed between the first region and the second region, and
wherein a doping concentration of the first doping region gradually increases from a bottom surface of the first doping region to a top surface of the first doping region.

20. The semiconductor device of claim 19, wherein a second doping region is formed between the third region and the fourth region, and
wherein a doping concentration of the second doping region gradually increases from a bottom surface of the second doping region to a top surface of the second doping region.

* * * * *